United States Patent
Yeo et al.

(10) Patent No.: US 7,176,092 B2
(45) Date of Patent: Feb. 13, 2007

(54) GATE ELECTRODE FOR A SEMICONDUCTOR FIN DEVICE

(75) Inventors: Yee-Chia Yeo, Singapore (SG); Hao-Yu Chen, Kaohsiung (TW); Fu-Liang Yang, Hsin-Chu (TW); Chenming Hu, Alamo, CA (US)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 189 days.

(21) Appl. No.: 10/825,872

(22) Filed: Apr. 16, 2004

(65) Prior Publication Data
US 2005/0233525 A1   Oct. 20, 2005

(51) Int. Cl.
*H01L 21/336* (2006.01)
(52) U.S. Cl. .............. 438/283; 438/197; 438/287; 257/E21.442; 257/E29.275; 257/E29.299
(58) Field of Classification Search .......... 438/197, 438/283, 287
See application file for complete search history.

(56) References Cited

U.S. PATENT DOCUMENTS

| | | | |
|---|---|---|---|
| 6,252,284 B1 | 6/2001 | Muller et al. | |
| 6,391,695 B1 | 5/2002 | Yu | |
| 6,391,782 B1 | 5/2002 | Yu | |
| 6,413,802 B1 | 7/2002 | Hu et al. | |
| 6,432,829 B2 | 8/2002 | Muller et al. | |
| 6,451,656 B1 | 9/2002 | Yu et al. | |
| 6,458,662 B1 | 10/2002 | Yu | |
| 6,492,212 B1 | 12/2002 | Ieong et al. | |
| 6,525,403 B2 | 2/2003 | Inaba et al. | |
| 6,657,252 B2 | 12/2003 | Fried et al. | |
| 6,767,793 B2 | 7/2004 | Clark et al. | |
| 6,794,718 B2 * | 9/2004 | Nowak et al. | 257/347 |
| 6,803,631 B2 * | 10/2004 | Dakshina-Murthy et al. | 257/349 |
| 2003/0151077 A1 * | 8/2003 | Mathew et al. | 257/250 |

OTHER PUBLICATIONS

X. Huang et al., "Sub-50 nm P-Channel FinFet", IEEE Transactions On Electron Devices, vol. 48, No. 5, May 2001, pp. 880-886.

(Continued)

*Primary Examiner*—Alexander Ghyka
(74) *Attorney, Agent, or Firm*—Duane Morris LLP

(57) ABSTRACT

A method for forming a gate electrode for a multiple gate transistor provides a doped, planarized gate electrode material which may be patterned using conventional methods to produce a gate electrode that straddles the active area of the multiple gate transistor and has a constant transistor gate length. The method includes forming a layer of gate electrode material having a non-planar top surface, over a semiconductor fin. The method further includes planarizing and doping the gate electrode material, without doping the source/drain active areas, then patterning the gate electrode material. Planarization of the gate electrode material may take place prior to the introduction and activation of dopant impurities or it may follow the introduction and activation of dopant impurities. After the gate electrode is patterned, dopant impurities are selectively introduced to the semiconductor fin to form source/drain regions.

29 Claims, 21 Drawing Sheets

OTHER PUBLICATIONS

F.-L. Yang et al., "35nm CMOS FinFETs", 2002 Symposium On VLSI Technology Digest of Technical Papers, Jun. 2002, pp. 104-105.

H.-S. P. Wong, "Beyond the conventional transistor", IBM J. Research and Development, vol. 46, No. 2/3, Mar./May 2002, pp. 133-168.

R. Chau et al., "Advanced Depleted-Substrate Transistors: Single-gate, Double-gate and Tri-gate" (Invited Paper), 2002 International Conference on Solid State Devices and Materials, Nagoya, Japan, Sep. 2002, pp. 68-69.

F.-L. Yang et al., "25 nm CMOS Omega FETs", International Electron Device Meeting, Dig. Technical Papers, Dec. 2002, pp. 255-258.

J. P. Colinge et al., "Silicon-On-Insulator 'Gate-All-Around Device'", International electron Device Meeting, Dig. Technical Papers, Dec. 1990, pp. 595-598.

E. Leobanddung et al., "Wire-channel and wrap-around-gate metal-oxide-semiconductor field-effect transistors with a significant reduction of short channel effects", J. Vacuum Science and Technology B, vol. 15, No. 6, Nov./Dec. 1997, pp. 2791-2794.

* cited by examiner

PRIOR ART

PRIOR ART

GATE ELECTRODE FOR A SEMICONDUCTOR FIN DEVICE

FIELD OF THE INVENTION

The present invention relates, most generally, to semiconductor devices and methods for forming the same. More particularly, the present invention relates to multiple gate transistor devices and is directed to methods for forming gate electrodes in such devices.

BACKGROUND OF THE INVENTION

The dominant semiconductor technology used for the manufacture of ultra-large scale integrated (ULSI) circuits is the metal-oxide-semiconductor field effect transistor (MOSFET) technology. The reduction in the size of MOSFETs has provided continued improvement in speed, performance, circuit density, and cost per unit function over the past decades. As the gate length of the conventional MOSFET is reduced, the source and drain areas increasingly interact with the channel and influence the channel potential. Consequently, transistors with short gate lengths suffer from problems related to the inability of the gate electrode to substantially control the "on" and "off" states of the channel. Phenomena such as reduced gate control associated with transistors with short channel lengths are termed short-channel effects. Increased body doping concentration, reduced gate oxide thickness, and ultra-shallow source-drain junctions are ways to suppress short-channel effects. For device scaling well into the sub-50 nanometer regime, however, the requirements for body-doping concentration, gate oxide thickness and source/drain (S/D) doping profiles has become increasingly difficult to meet with conventional device structures based on bulk silicon substrates. Innovations in front-end process technologies with the introduction of alternative device structures are needed to sustain the historical pace of device scaling.

As technology continues into the sub-30 nanometer regime, the promising approach for controlling short-channel effects is to use an alternative transistor structure with more than one gate, i.e., multiple gate transistors. An exemplary multiple gate transistor is shown in the plan view of FIG. 1 which represents the prior art. The multiple gate transistor of FIG. 1 includes a semiconductor fin 2 formed over insulator 4 which is formed over a substrate. Gate electrode 8 straddles semiconductor fin 2 and a gate dielectric (not shown) is disposed between semiconductor fin 2 and gate electrode 8. The transistor active areas (source, drain and channel) are formed in the semiconductor fin. Examples of multiple-gate transistors include double-gate transistors, triple-gate transistors, omega field-effect transistors, and a surround-gate or wrap-around gate transistor. Multiple-gate transistor structures are expected to extend the scalability of CMOS technology beyond the limitations of conventional bulk MOSFET and realize the ultimate limit of silicon MOSFETs. The introduction of additional gates in the multiple-gate transistors improves capacitive coupling between gates and the channel, increases the control of the channel potential by the gate, helps suppress short-channel effects, and extends the scalability of the MOS transistor.

The simplest example of a multiple-gate transistor is the double-gate transistor such as described in U.S. Pat. No. 6,413,802 B1 issued to Hu et al., the contents of which are hereby incorporated by reference. FIG. 2A is a prior art cross-sectional view of a double-gate transistor and illustrates gate electrode 8 that straddles the channel formed in the semiconductor fin structure 2, thus forming a double-gate structure. Semiconductor fin 2 includes fin height 18 and fin width 6. There are two gates, one on each sidewall 12 of semiconductor fin 2, along which gate dielectric 14 extends. U.S. Pat. No. 6,413,802 B2 provides that the semiconductor fin that forms the transistor channel, is a thin silicon fin defined using an etching mask and formed on an insulating layer such as insulator 4, which is a silicon oxide layer formed over silicon substrate 10. A gate oxidation process is performed prior to the removal of etching mask 16 and the oxidation process is followed by gate material deposition and patterning that forms gate electrode 8 which traverses (i.e. straddles) semiconductor fin 2 to form a double-gate structure overlying the top (etching mask 16) and sidewalls 12 of semiconductor fin 2. Both the source-to-drain direction and the gate-to-gate direction are along the plane of the substrate surface.

Another example of a multiple-gate transistor known in the art is a triple-gate transistor, an exemplary one of which is illustrated in FIG. 2B. The plan view of such an exemplary triple-gate transistor is as illustrated in FIG. 1. The triple-gate transistor has a gate electrode that forms three gates: one over top surface 20 of semiconductor fin 2, and the other two along fin sidewalls 12 as in the double-gate structure shown in FIG. 2A. Gate dielectric 14 extends along sidewalls 12 and top surface 20.

FIG. 2C shows an omega field-effect transistor (FET) or simply omega-FET, so called because the gate electrode has an omega type shape in the cross-sectional view. The omega-FET is a variation of the triple-gate transistor shown previously in FIG. 2B as gate dielectric 14 extends along sidewalls 12 and over top 20. Gate electrode 8 encroaches semiconductor fin 2 at encroachment locations 28 due to notch 24 that extends beneath semiconductor fin 2 due to the recession of the upper surface of insulator 4. The omega-FET resembles a gate-all-around (GM) transistor, provides excellent scalability and is manufactured using a very manufacturable process similar to that of the double or triple-gate transistor. Due to the gate extension or encroachment beneath the semiconductor fin, the omega-FET is an FET with a gate that almost wraps around the fin body. The encroachment 28 of gate electrode 8 under semiconductor fin 2 helps to shield the channel from electric field lines from the drain and improves gate-to-channel controllability, thus alleviating the drain-induced barrier lowering effect and improving short-channel performance.

The described multiple-gate transistor structures, i.e., the double-gate transistor, the triple-gate transistor and the omega-FET, have a common feature in that the sidewall surfaces of the semiconductor fins are used for a significant amount of source-to-drain current conduction. Essentially, the effective gate width of the multiple-gate transistor is a function of the fin height. In a double-gate transistor, the gate width is twice the fin height and in a triple-gate transistor, the gate width is twice the fin height plus the fin width. (Fin height 18 and fin width 6 are shown in FIGS. 2A and 2B.) As such, as fin height increases, the amount of current deliverable by the device similarly increases. To deliver maximum current, then, it is desirable to maximize fin height. A tradeoff exits, however, because as fin height increases, it becomes increasingly difficult to form the gate electrode by patterning the gate material that is formed over the fin. This undesirable aspect is also common to all of the aforementioned gate transistors.

Each of the multiple-gate transistors includes a semiconductor fin that forms the active region and is disposed above the substrate surface. The formation of a gate electrode that straddles the semiconductor fin involves the deposition of a substantially conformal gate electrode material over the semiconductor fin followed by a definition step using techniques such as photolithography and an etching step such as plasma etching, to form the gate electrode. The formation of the gate electrode over the large step height introduced by the semiconductor fin presents a very challenging problem. As deposited, the substantially conformal gate electrode material has a non-planar top surface with a significant step as it traverses the semiconductor fin. This is shown in FIG. 3A. Surface 34 of gate electrode material 8 is clearly non-planar and therefore presents patterning problems.

FIG. 3B shows mask material 38 formed over the structure shown in FIG. 3. Mask material 38 may be a photoresist or other photosensitive material and is commonly formed by spin-coating which produces a planar top surface 40. It can therefore be seen that the thickness of the mask material varies from greater thickness 44 to lesser thickness 42 over step 52 influenced by semiconductor fin 2. This varying thickness makes it difficult to accurately transfer the pattern on the lithographic mask 46 to mask material 38. The pattern may be considered opaque region 48 within transparent region 50 of the exemplary lithographic mask 46. Opaque region 48 has a constant width. The thinner portions 42 of mask material 38 over step 52 are thinner than other portions 44 of mask material 38 and are effectively exposed to a greater extent than other portions of the mask material. After exposure and develop, the patterned mask material 54 may be formed with different widths as shown in FIG. 3C. FIG. 3C shows that narrow portion 56 of patterned mask material 54 over step 52, is substantially narrower than other portions of pattern mask material 54. When unmasked portions 58 of gate electrode material 8 are subsequently etched to expose insulator 4 such as shown in FIG. 3D, the etched gate electrode 62 is formed with a non-uniform gate length, i.e., narrow portion 64 is narrower than other portions of etched gate electrode 62. This is also shown in the plan view of FIG. 3E which shows patterned gate electrode 62 having narrow portion 64 with width 65 representing a gate length and other portion 66 with width 67. It can be seen that width 67 is greater than gate length 65 even though formed from a mask feature (48) having constant width. The gate width of vertical portion 63 shown in FIGS. 3D and 3E, may be anywhere between width 65 and width 67. The non-uniform and uncontrollable critical gate length dimension is undesirable and represents one shortcoming of conventional multiple-gate transistor technology.

Another shortcoming of the conventional technology used to form multiple gate transistors is that the gate electrode is usually doped in the same process operation used to dope the source and drain regions. In conventional transistors, the gate electrode is substantially planar, as are the source and drain regions. In a multiple-gate transistor or semiconductor fin device, however, both the gate electrode and the source and drain regions are essentially three dimensional structures. Because the source/drain, and gate electrode materials have different doping requirements, both spatially and concentration-wise, it would be desirable to introduce dopant impurities in the source/drain region and the gate electrode material in different processing operations.

U.S. Pat. No. 6,413,802 B1 (Hu et al.) and U.S. Pat. No. 6,432,829 to Muller et al., hereby incorporated by reference as if set forth in its entirety, provide processes for manufacturing multiple-gate transistors. Neither of these references teach the planarization of the gate electrode material prior to photolithographic patterning of the gate electrode, however. U.S. Pat. No. 6,492,212 issued to Ieong et al., hereby incorporated by reference as if set forth in its entirety, provides a method for forming a double-gate transistor using several planarization steps to form the gate electrode of a multiple-gate transistor. The multiple planarization steps required by this reference, however, increase manufacturing costs. Additionally, U.S. Pat. No. 6,492,212 fails to provide methods for optimizing the doping of the gate electrode and the source/drain regions of the multiple-gate transistors.

The present invention is directed to addressing the above-described shortcomings associated with multiple-gate transistor manufacturing technologies.

SUMMARY OF THE INVENTION

To address these and other needs and in view of its purposes, the present invention provides a method for forming a gate electrode for a multiple gate transistor in a semiconductor device. The method includes providing a substructure comprising a semiconductor fin disposed over an insulating layer and a gate dielectric on the semiconductor fin and forming a gate electrode material over the gate dielectric and semiconductor fin, the gate electrode material having a non-planar top surface. The method further provides introducing dopant impurities into the gate electrode material and then annealing to activate the dopant impurities in the gate electrode material. The method further provides planarizing the top surface to form a planarized top surface.

In one embodiment, the method includes introducing the dopant impurities and annealing prior to planarizing the top surface of the gate electrode material. In another exemplary embodiment, the invention provides for planarizing the top surface of the gate electrode material prior to introducing and annealing the dopant impurities.

According to either of the exemplary embodiments, a method is provided that produces a doped, planar gate electrode material formed over a semiconductor fin. The planarized doped gate electrode material is advantageously formed such that subsequent patterning methods can be used to produce a gate electrode of constant width that straddles the semiconductor fin, thereby providing a multiple gate transistor with a uniform gate length. After the gate electrode is formed, source and drain regions may be formed in the semiconductor fin and are doped independently of the gate electrode.

BRIEF DESCRIPTION OF THE DRAWING

This invention is based understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing. Included are the following figures:

FIGS. 5A–5G and FIGS. 6A–6F combine to illustrate the first sequence of processing operations used to form the patterned gate electrode according to the first exemplary method of the invention;

FIGS. 8A–8G and FIGS. 6A–6F, in combination, illustrate the sequence of processing operations used to form a patterned gate electrode material according to the second method of the invention as provided in FIG. 7.

DETAILED DESCRIPTION OF THE INVENTION

The present invention provides methods for forming a patterned gate electrode over a semiconductor fin that provides the active area in multiple-gate transistors. The methods of the present invention are applicable to double-gate transistors, triple-gate transistors and omega-FET's, each of which has been previously described. Therefore, while the methods of the present invention, e.g., the process sequences outlined in the flowcharts of FIGS. 4 and 7, will be shown in subsequent figures with respect to an exemplary triple-gate transistor, it should be understood that the triple-gate transistor is exemplary only and the methods of the present invention may be equally used to form patterned gate electrodes over double-gate transistors, omega-FETs and other multiple gate transistors.

Figure 4:
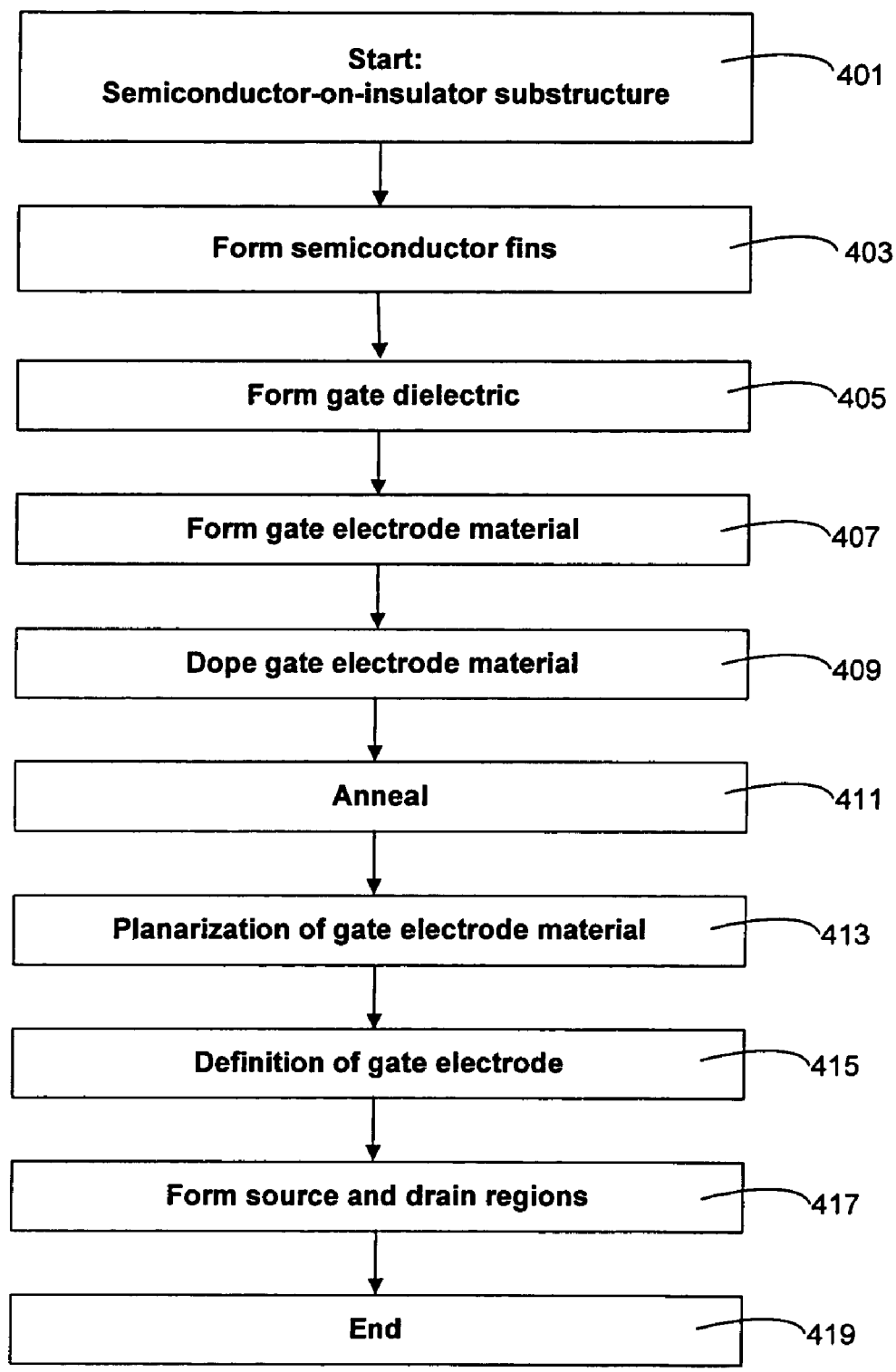
FIG. 4 is a flowchart showing an exemplary first method for forming a patterned gate electrode according to the invention.

FIG. 4 is a flowchart illustrating a first exemplary method of the invention. FIG. 4 shows that, among other things, the doping of the gate electrode material 409 and the annealing 411 take place before the planarization of the gate electrode material 413. FIGS. 5A–5G (in cross-section) and 6A–6F (in three-dimensional isometric views) combine to illustrate the sequence of processing operations shown in FIG. 4.

Figure 5A:
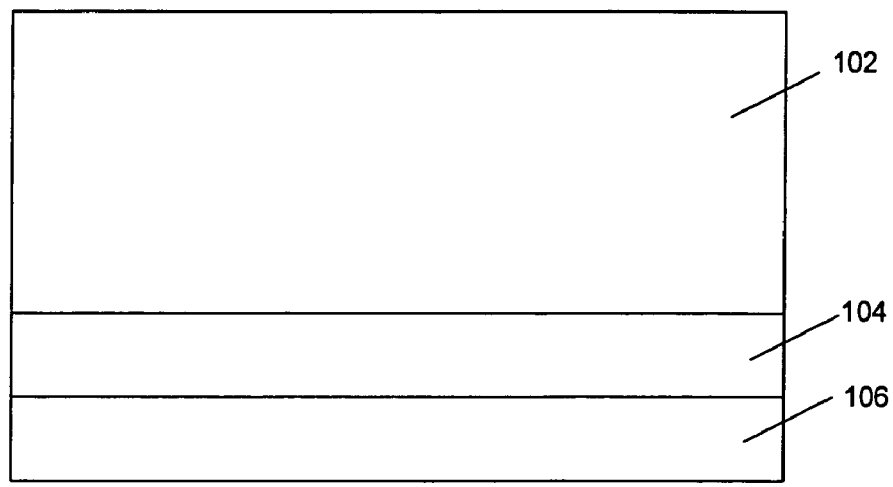
FIGS. 5A–5G are cross-sectional views showing the first part of the sequence of processing operations used to form a pattered gate electrode according to the first exemplary method of the invention as provided in FIG. 4.

Now turning to FIG. 5A, semiconductor layer 102 is formed over insulating layer 104 which is formed over substrate 106. Semiconductor layer 102 may be an elemental semiconductor such as silicon, an alloy semiconductor such as silicon-germanium or a compound semiconductor such as gallium arsenide or indium phosphide. Other suitable semiconductor materials may be used in other embodiments. Semiconductor layer 102 will be formed into a semiconductor fin which will provide the active areas, i.e., source/drain and channel, of the multiple-gate transistor. Semiconductor layer 102 may include a thickness within the range of 200 to 5000 angstroms but other thicknesses may be used in other exemplary embodiments. Insulating layer 104 may be formed of any suitable dielectric or insulator, and may advantageously be formed of silicon oxide or silicon nitride in exemplary embodiments. Insulating layer 104 may have a thickness in the range of 100 angstroms to 2000 angstroms, but other thicknesses may be used in other exemplary embodiments. Substrate 106 is a suitable substrate used in the semiconductor manufacturing industry, such as a silicon wafer.

Figure 5B:
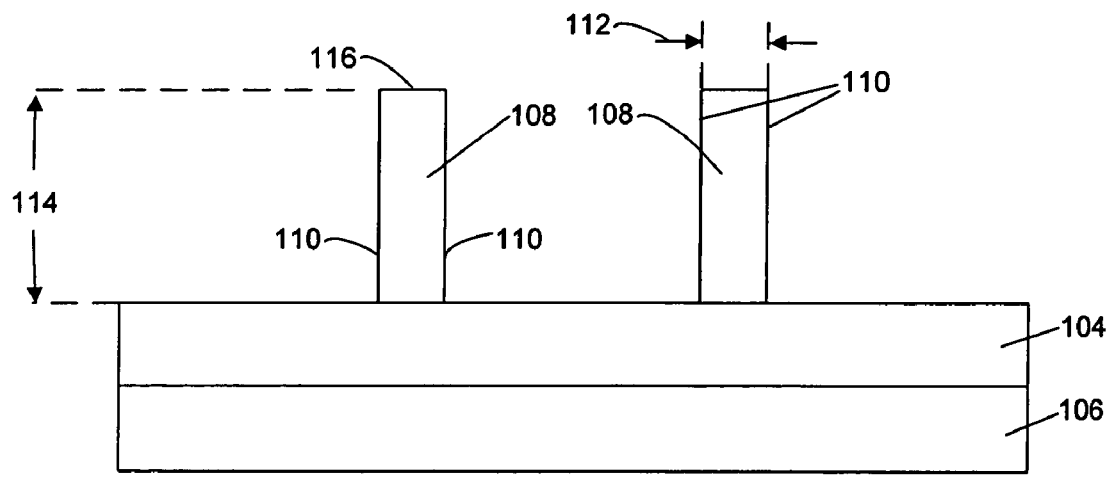
Figure 5C:
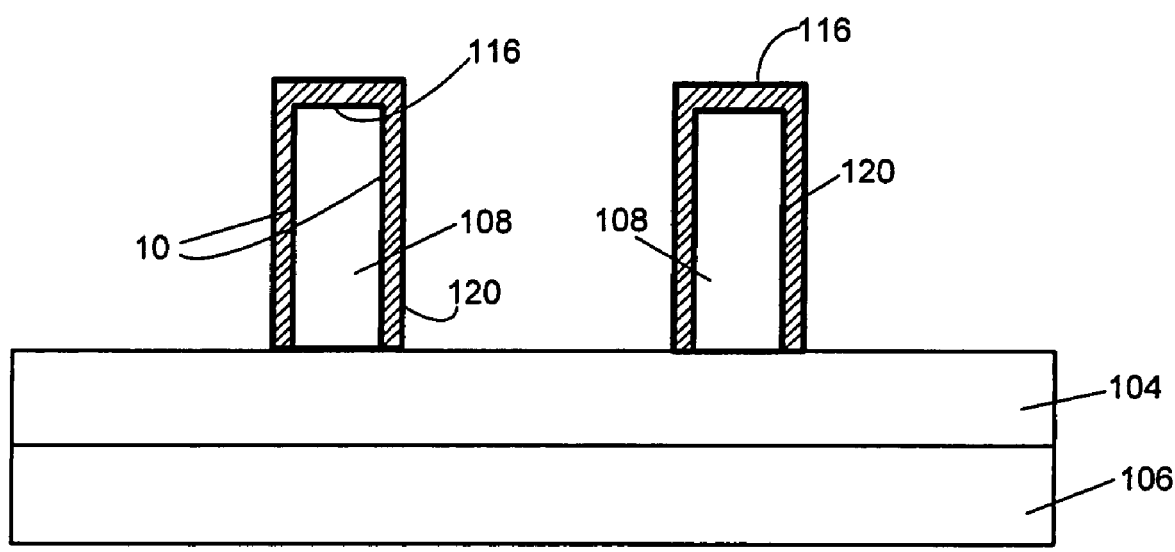

Turning to FIG. 5B, semiconductor fins 108 are formed by patterning semiconductor layer 102 shown in FIG. 5A. The patterning may be accomplished by forming a commonly used mask material such as photoresist or silicon oxide over semiconductor layer 102, then forming a pattern in the mask material and etching semiconductor layer 102 using conventional methods. In this manner, a plurality of semiconductor fins 108 may be simultaneously formed over an insulator such as insulating layer 104. Semiconductor fins 108 extend in and out of the plane of the page of the drawing and include fin width 112, fin height 114, top surface 116 and sidewalls 110. Fin height 114 may be within the range of 200–5000 angstroms but will advantageously be in the low end of the range, e.g. 500 angstroms, in an exemplary embodiment. The exemplary embodiment shown in FIG. 5B is depicted after removal of the mask material. In another exemplary embodiment such as used for a double-gate transistor, an inorganic masking material may remain over top surface 116 during the subsequent formation of the gate dielectric which is shown in FIG. 5C. In an exemplary triple-gate transistor, current will travel along top surface 116 and sidewalls 110 along the direction orthogonal to the plane of the illustration of FIG. 5B.

Gate dielectric layer 120 is then formed on semiconductor fin 108, including on fin sidewalls 110 and top surface 116 as in FIG. 5C. Gate dielectric 120 may be formed using thermal oxidation, chemical vapor deposition, sputtering or suitable techniques. In one exemplary embodiment, gate dielectric 120 may include a thickness that is substantially uniform. In an exemplary embodiment, the gate dielectric 120 may include a thickness of less than 10 angstroms and in other exemplary embodiments, gate dielectric 120 may include a thickness within the range of 3 angstroms to 100 angstroms. In another exemplary embodiment, gate dielectric 120 on top surface 116 of semiconductor fin 108 may have a different thickness than that of gate dielectric 120 formed on sidewalls 110 of semiconductor fin 108. The presence and extent of such a thickness difference will depend upon the method used to form gate dielectric 120. In one exemplary embodiment, the thickness of gate dielectric 120 on top surface 116 may be less than 20 angstroms. Gate dielectric 120 may be formed of silicon dioxide, silicon oxynitride, or high-k dielectric materials such as lanthanum oxide, $La_2O_3$, aluminum oxide, $Al_2O_3$, hafnium oxide, $HfO_2$, hafnium oxynitride, HfON, or zirconium oxide, $ZrO_2$, but other suitable gate dielectric materials such as high-k dielectrics having a permittivity of greater than 5 relative to free space may be used in other exemplary embodiments.

Figure 5D:
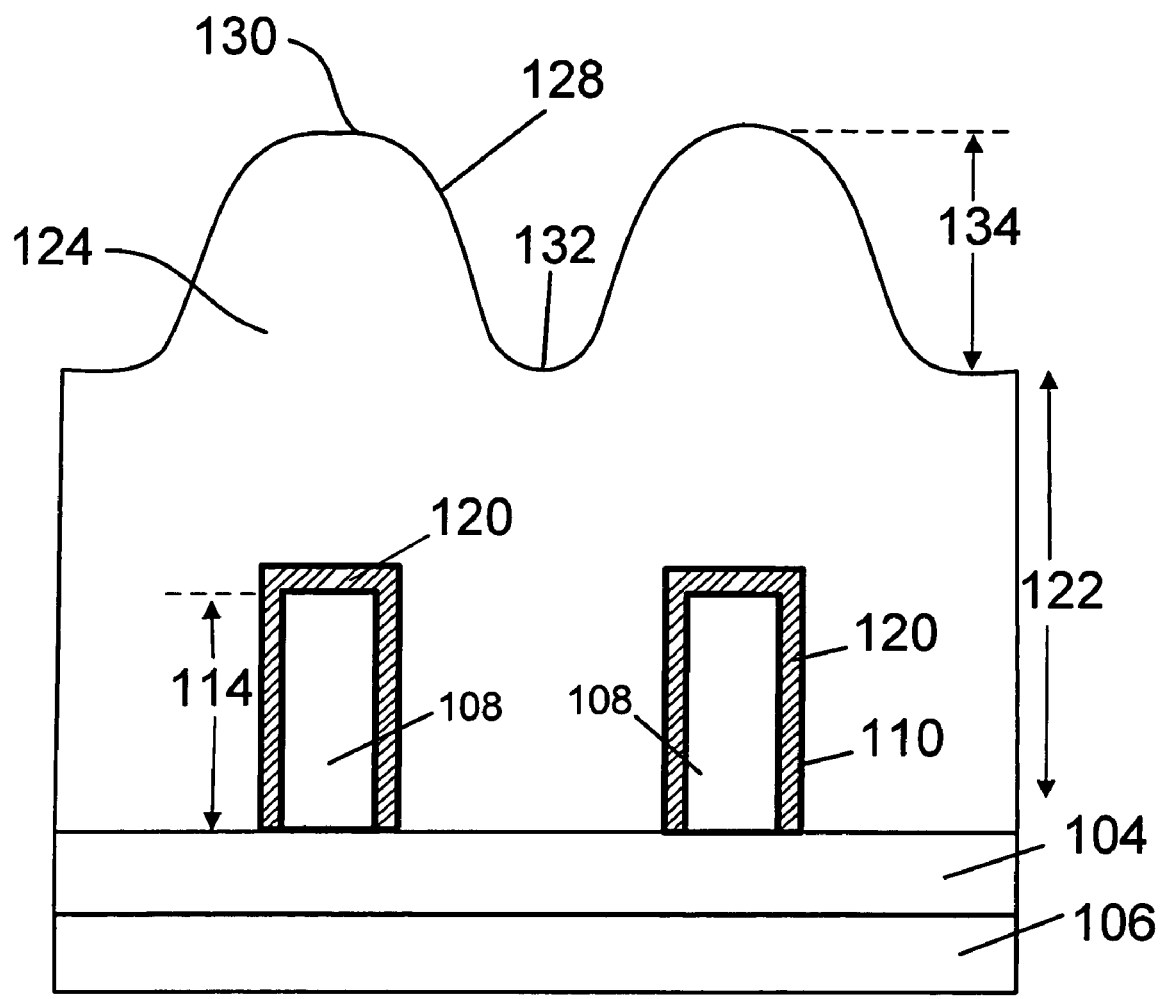

FIG. 5D shows gate electrode material 124 formed over the structure shown in FIG. 5C. Gate electrode material 124 may be polycrystalline silicon (polysilicon), polycrystalline silicon germanium (poly-SiGe) or other conductive or semi-conductive materials. Gate electrode material 124 may be undoped or lightly doped as deposited and it may be deposited using chemical vapor deposition (CVD) or other suitable and conventional techniques. Thickness 122 may range from 500–5000 angstroms but other thicknesses may also be used. In one exemplary embodiment, gate electrode material 124 may be undoped polysilicon having a thickness of about 2000 angstroms. Thickness 122 may advantageously be chosen to be significantly greater than fin height 114 in one embodiment. Gate electrode material 124 is substantially conformally deposited and therefore includes a non-planar top surface 128 that includes peaks 130 and valleys 132. Peaks 130 are formed over respective semiconductor fins 108. Non-planar top surface 128 therefore includes step height 134 which is generally about the same as fin height 114 shown in FIG. 5B. Using conventional technology, such a step height 134 introduces significant problems in the transfer of a predefined pattern from a lithographic mask over peaks 130 and onto the gate electrode material. The patterning issue produced by step height 134, is advantageously addressed in one aspect of the invention.

Figure 5E:
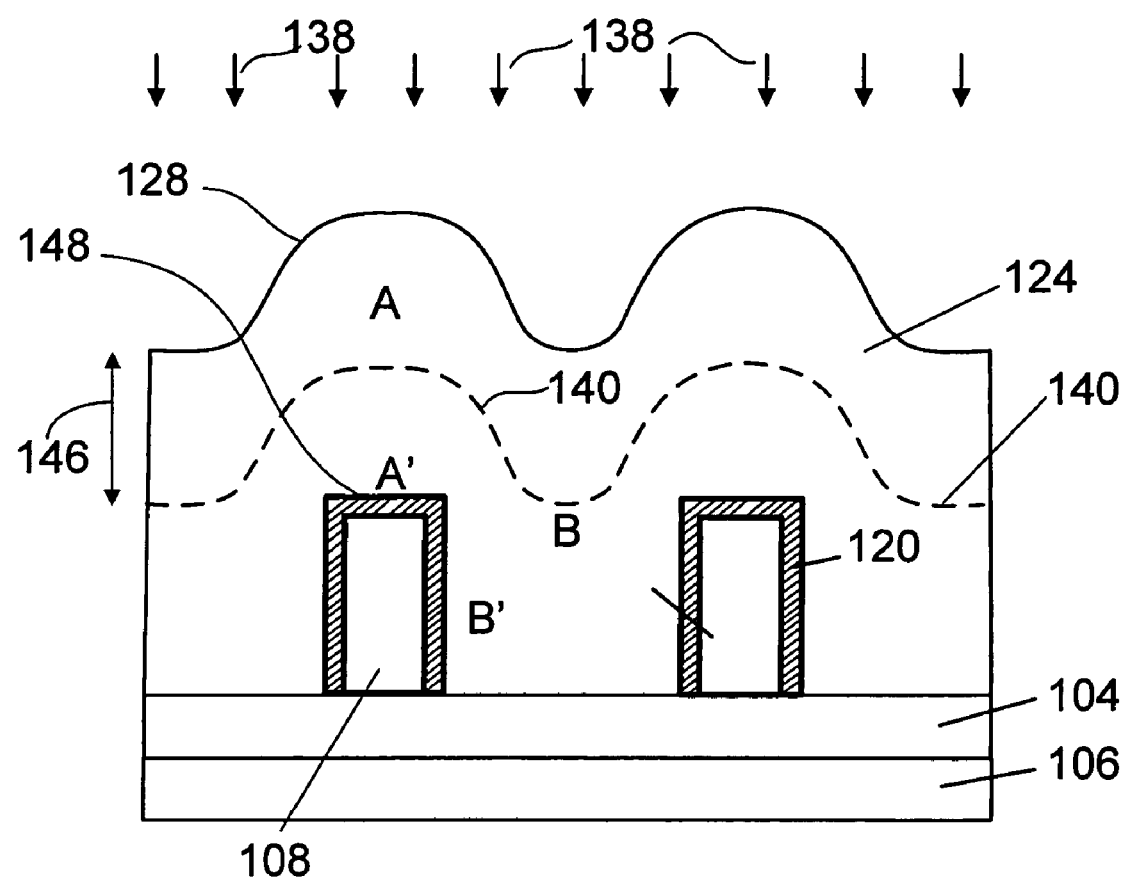

FIG. 5E illustrates the introduction of dopant impurities into gate electrode material 124. In one exemplary embodiment, the dopant impurities may be introduced using ion implantation, indicated by arrows 138. Plasma immersion ion implantation may also be used. The ion implantation introduces dopant impurities such that a peak dopant concentration is located at an implant depth below non-planar top surface 128. Location 140 of the peak concentration of implanted ions is indicated by a dashed line which has substantially the same profile as non-planar top surface 128, i.e., implant depth 146 is substantially constant. The location 140 of peak concentration of implanted ions is chosen in conjunction with the subsequent annealing process such that the dopant impurity concentration is advantageously maximized at the interfaces formed between gate electrode material 124 and gate dielectric 120, in order to reduce gate depletion effects which compromise device performance. However, an excess of dopant impurities at top interface 148, for example, may cause dopant impurities to penetrate gate dielectric 120 and diffuse into semiconductor fin 108. This undesirably causes threshold voltage shifts and degrades control of short-channel effects. FIG. 5E shows that the distance between point A, located at location 140 of peak concentration of implanted ions and point A', at the top interface 148 between the gate electrode material and the gate dielectric, is approximately the same as the distance between point B (also on location 140) and point B' located at the lower sidewall portion of the gate dielectric 120. Because distance A–A' and distance B–B' are approximately the same, the dopants from point A and point B will diffuse and reach points A' and B', respectively, at approximately the same time during a suitable thermal annealing process. This minimizes the likelihood of any dopant impurity penetration. According to conventional or plasma immersion ion implantation techniques, a dose of $1 \times 10^{15}$ cm$^{-2}$ may be used in an exemplary embodiment but other dosages may be used in other exemplary embodiments. In an exemplary embodiment, ion implantation energy may range from 100 volts to 200 keV, but other implant energies may be used in other exemplary embodiments. Depending on the technology used, either P-type dopant impurities or N-type dopant impurities may be introduced. P-type dopant impurities may be boron or indium or a combination thereof and N-type dopant impurities may include phosphorus, arsenic, antimony and combinations thereof. Other dopant impurities may be used in other exemplary embodiments.

Figure 5F:
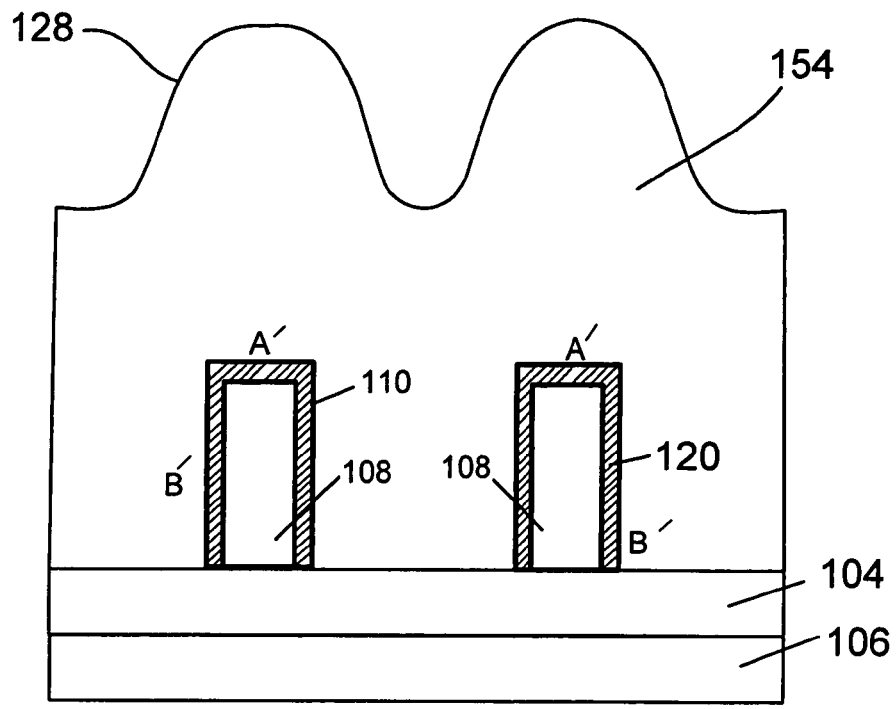

FIG. 5F shows the structure after a suitable thermal annealing process has taken place. Doped gate electrode material 154 advantageously includes dopant impurity concentrations at points A' and B' that are substantially the same. This produces the advantageous result that the gate electrode includes approximately the same dopant concentration at all portions that form interfaces with the gate dielectric. The annealing process that activates the dopant impurities and urges the diffusion of the same, may take place at a temperature within the range of 500 to 800° Celsius but other annealing temperatures may be used in other exemplary embodiments. The doped gate electrode material 154 including non-planar top surface 128 shown in FIG. 5F, is then planarized to produce the structure in FIG. 5G. Doped gate electrode material 154 is more accurately described as a doped and annealed/activated gate electrode material.

Figure 5G:
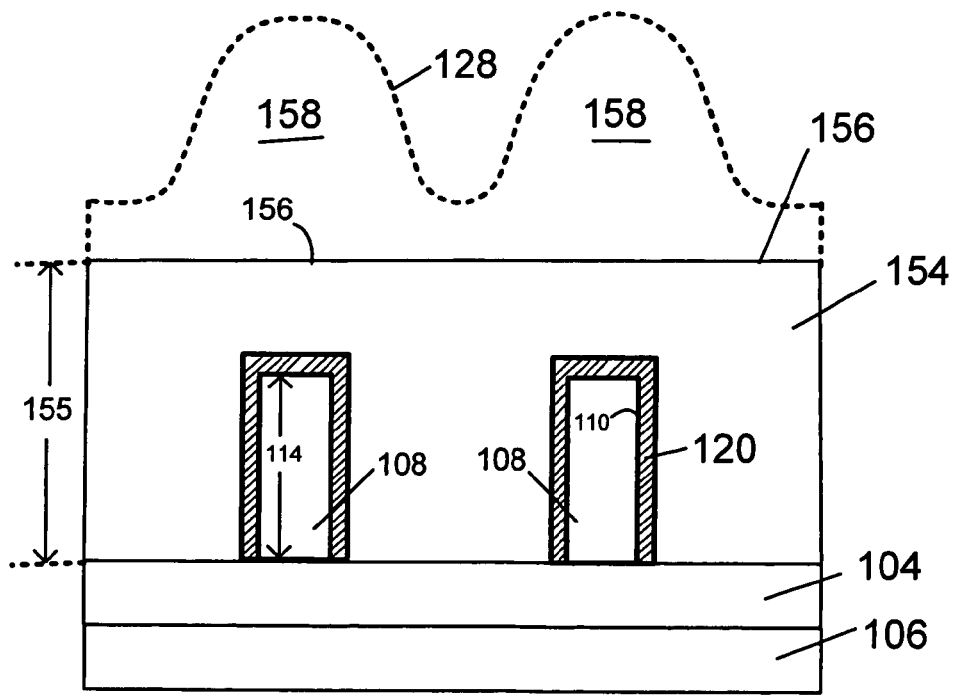

FIG. 5G shows doped gate electrode material 154 with planarized top surface 156. In one exemplary embodiment, a chemical mechanical polishing operation may be used to planarize the structure by removing portions 158 bounded by the dashed line to produce planarized doped gate electrode material 154 with height 155 which may lie within the range of 500–4000 angstroms and will be chosen in conjunction with fin height 114. In an exemplary embodiment, the root-mean-square surface roughness of planarized top surface 156 may be less than 100 angstroms. Height 155 may advantageously be chosen to be significantly greater than fin height 114.

Figure 6A:
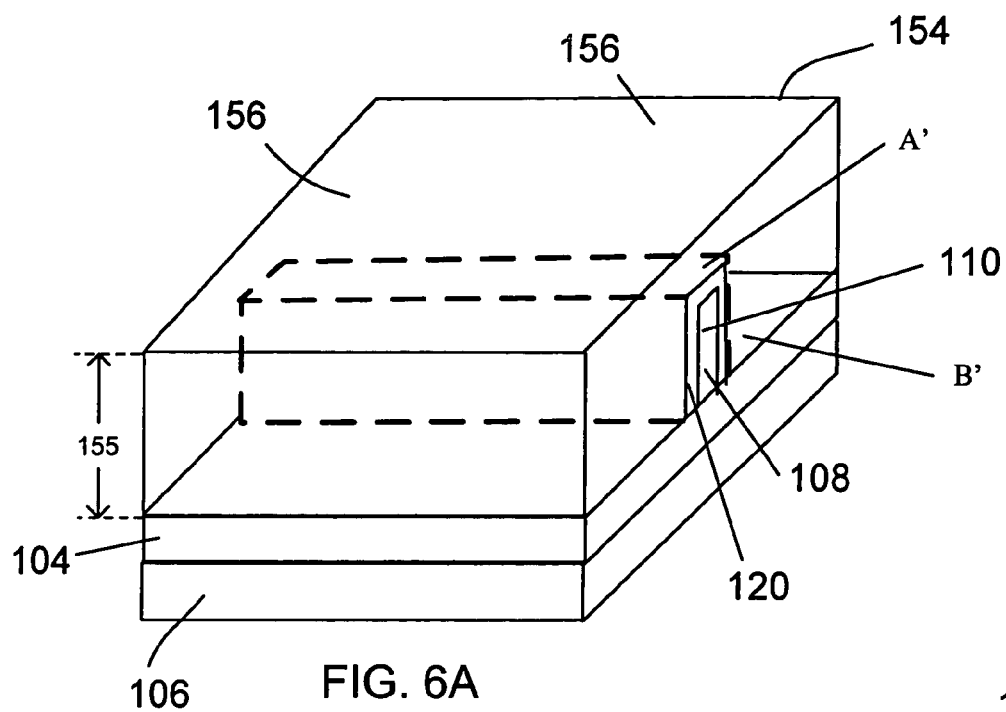
FIGS. 6A–6F are three-dimensional isometric views showing the second part of the sequence of processing operations used to form a patterned gate electrode according to the first exemplary method of the invention as provided in FIG. 4.

The structure shown in the cross-sectional view in FIG. 5G is also presented in three-dimensional isometric view in FIG. 6A, in which the dopant impurity concentration at point A' is advantageously equal to that at point B'.

Figure 6B:
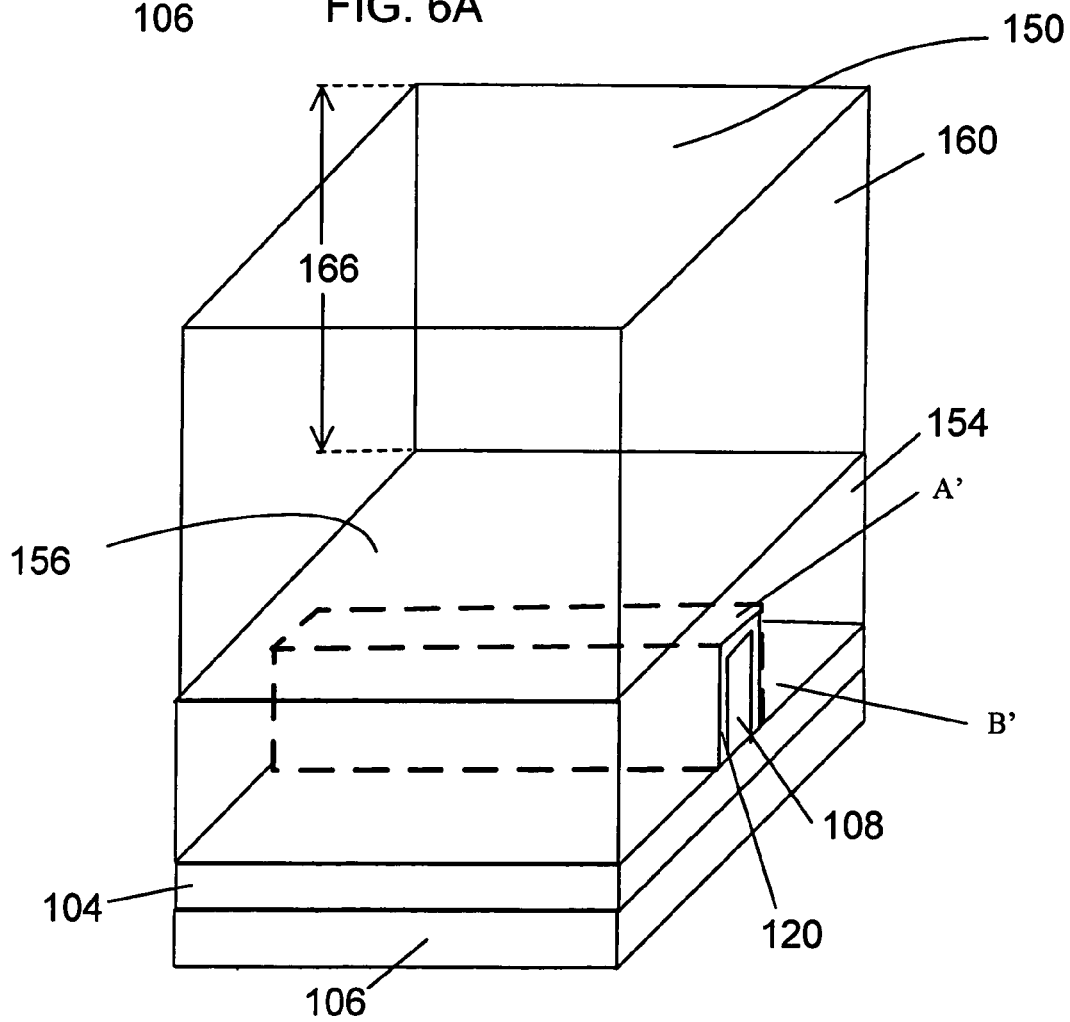

FIG. 6B shows mask material 160 formed over planarized top surface 156 of doped, annealed gate electronic material 154. Mask material 160 may be a single layer of photoresist or in may include multiple layers such as a photoresist layer formed over a silicon nitride, silicon oxynitride, silicon oxide or other layer. Mask material 160 has a substantially uniform thickness because it is formed over planar top surface 156. Mask material 160 includes planar top surface 150 and substantially uniform thickness 166. Because of planar top surface 156 of mask material 160 and substantially uniform thickness 166, a desired predefined mask pattern can accurately be transferred from a mask to mask material 160 and a subsequent etching process can be used to accurately transfer the pattern to the gate electrode material 154.

Figure 1:
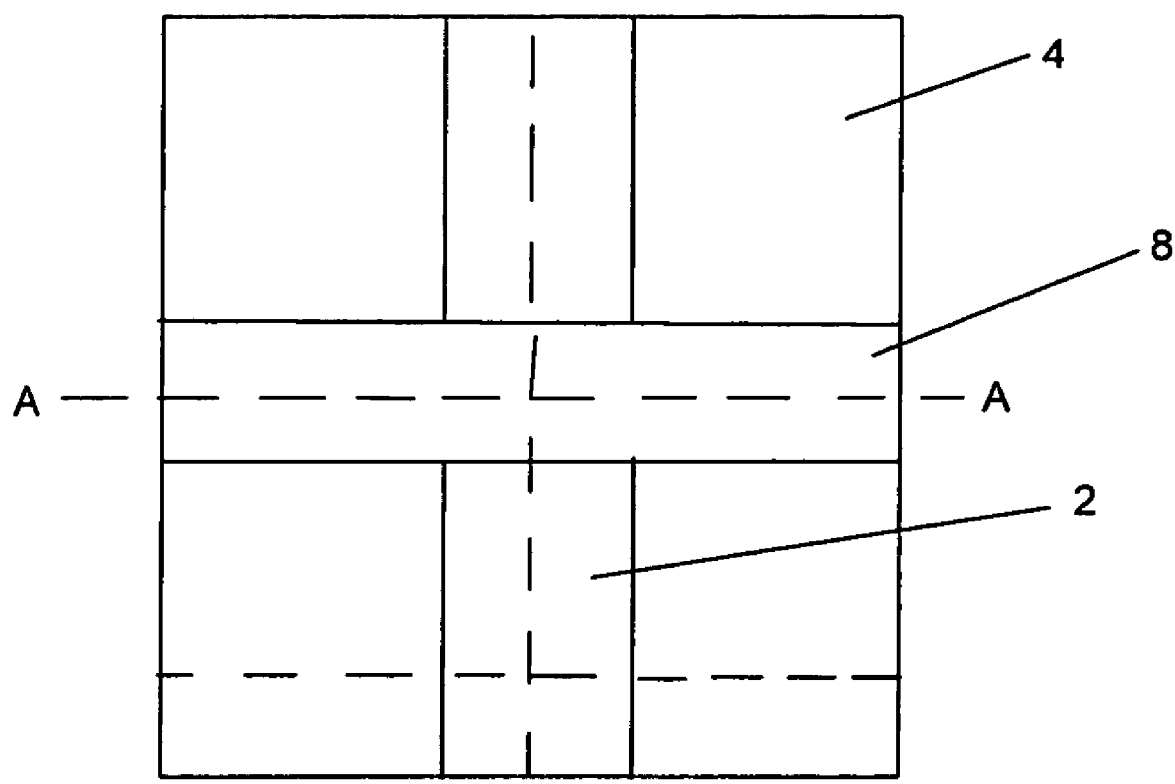
FIG. 1 is a plan view of a multiple-gate transistor according to PRIOR ART. The multiple-gate transistor may be a double-gate transistor, a triple-gate transistor or an omega field-effect transistor (FET)
Figure 2A:
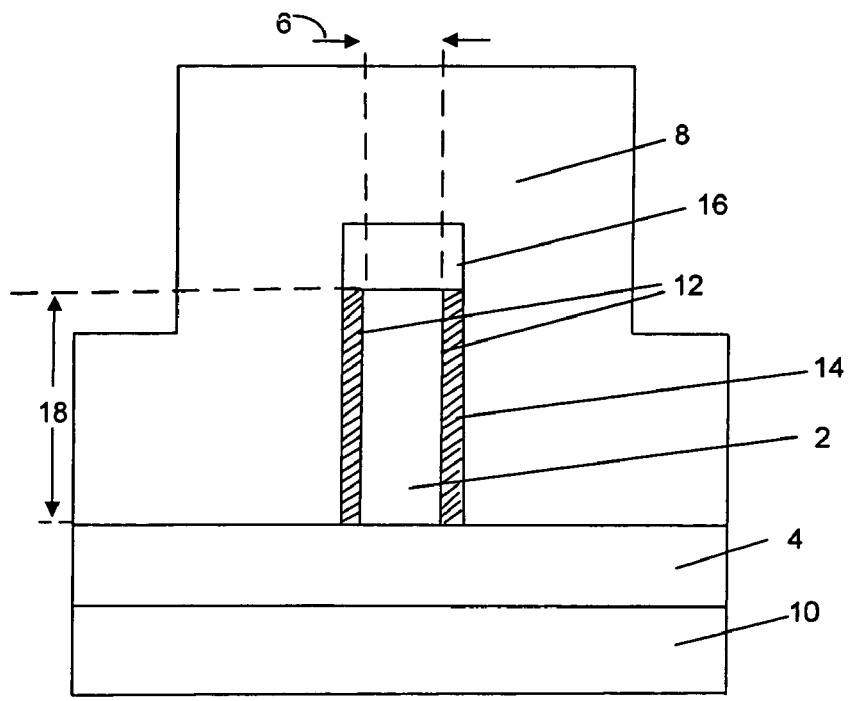
FIGS. 2A–2C are cross-sectional views taken along line A—A of the PRIOR ART generic multiple-gate transistor of FIG. 1 and illustrate a double-gate transistor, a triple-gate transistor and an omega-FET, respectively.
Figure 2B:
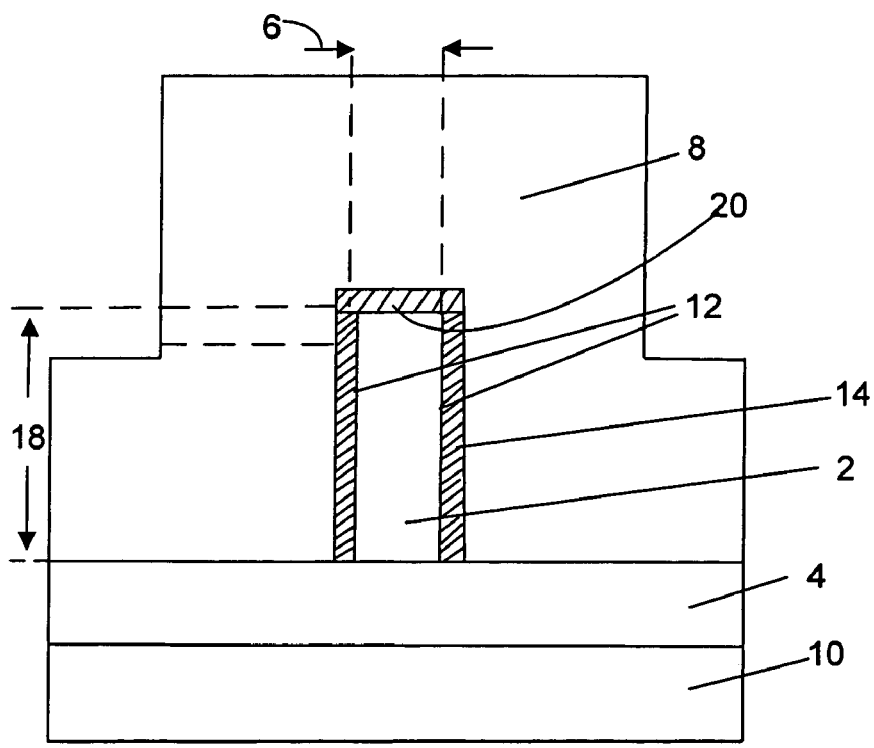
Figure 2C:
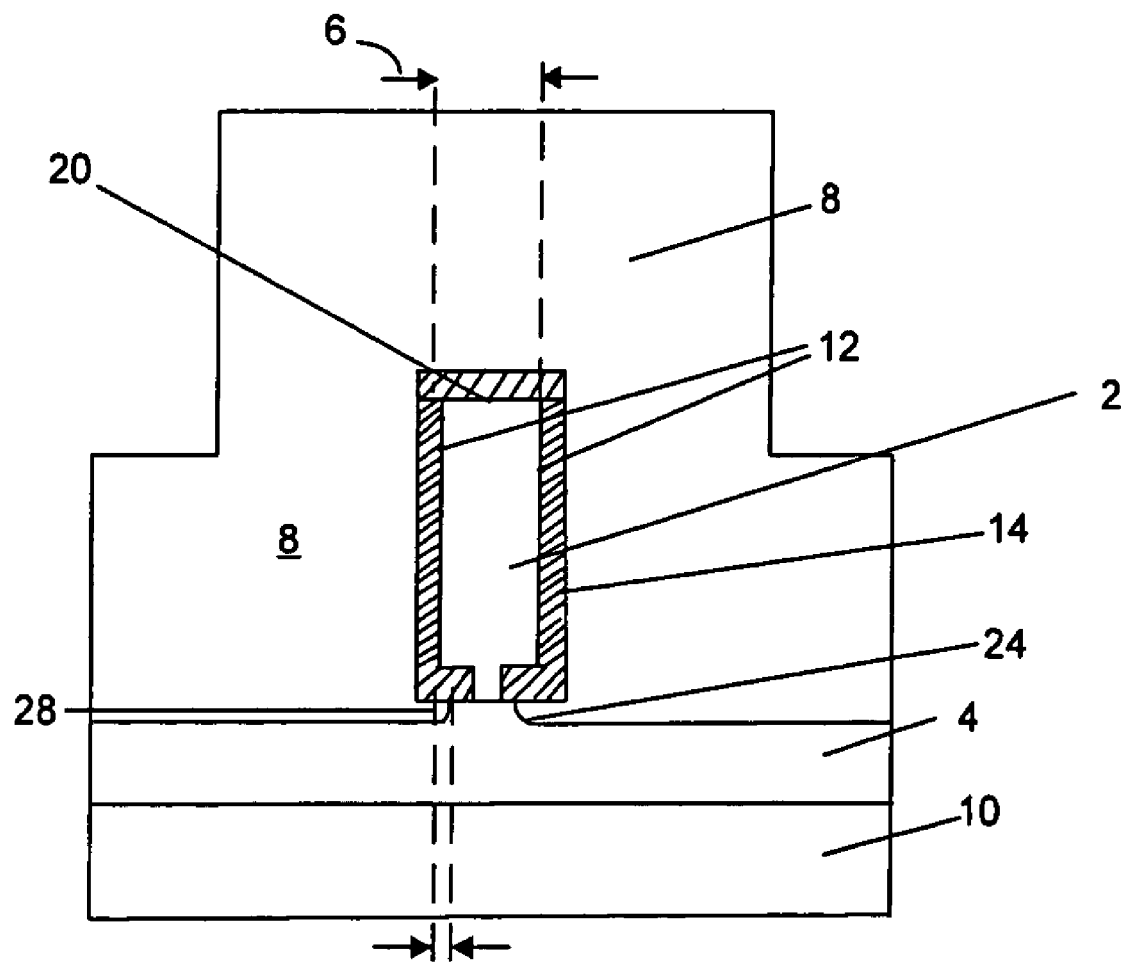
Figure 3A:
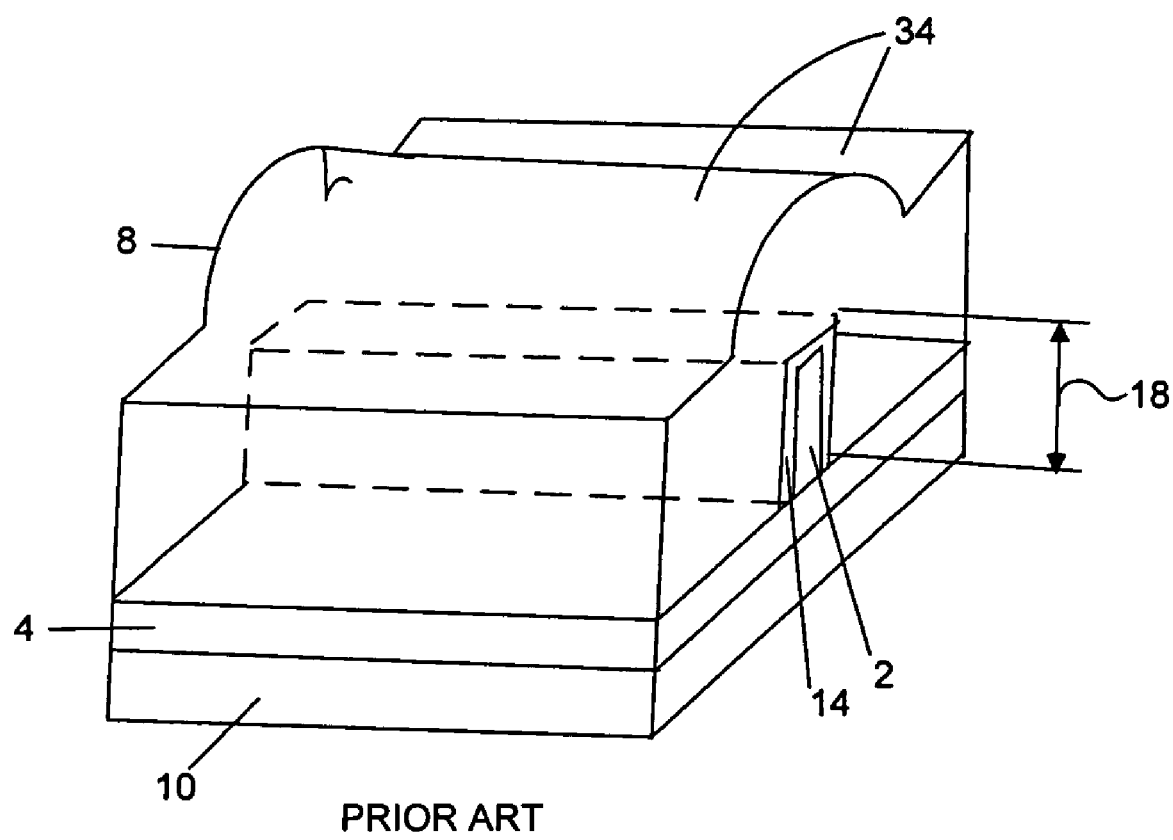
FIGS. 3A–3D are three-dimensional isometric views and FIG. 3E is a plan view showing a process sequence used to form a patterned gate electrode over a semiconductor fin according to the PRIOR ART.
Figure 3B:
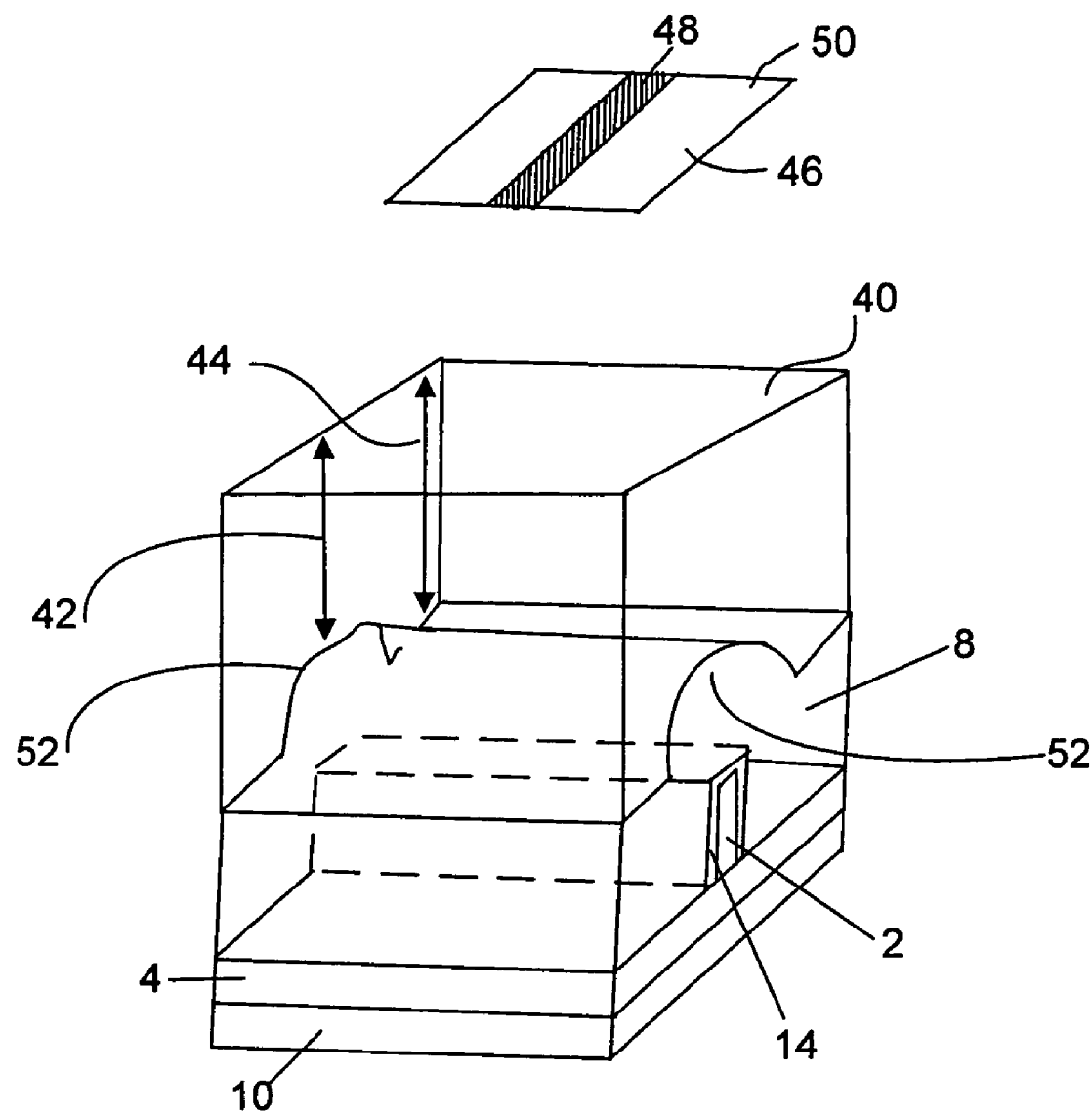
Figure 3C:
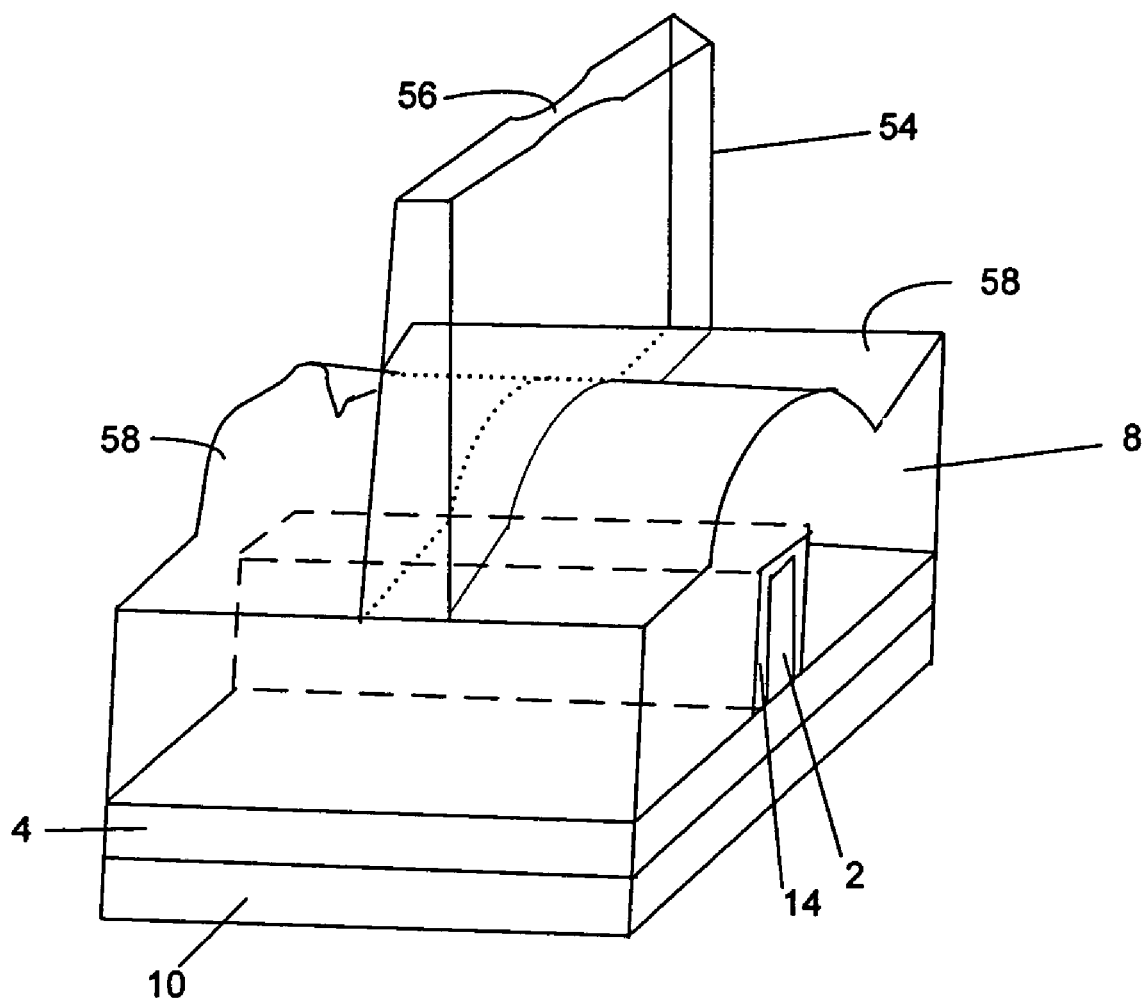
Figure 3D:
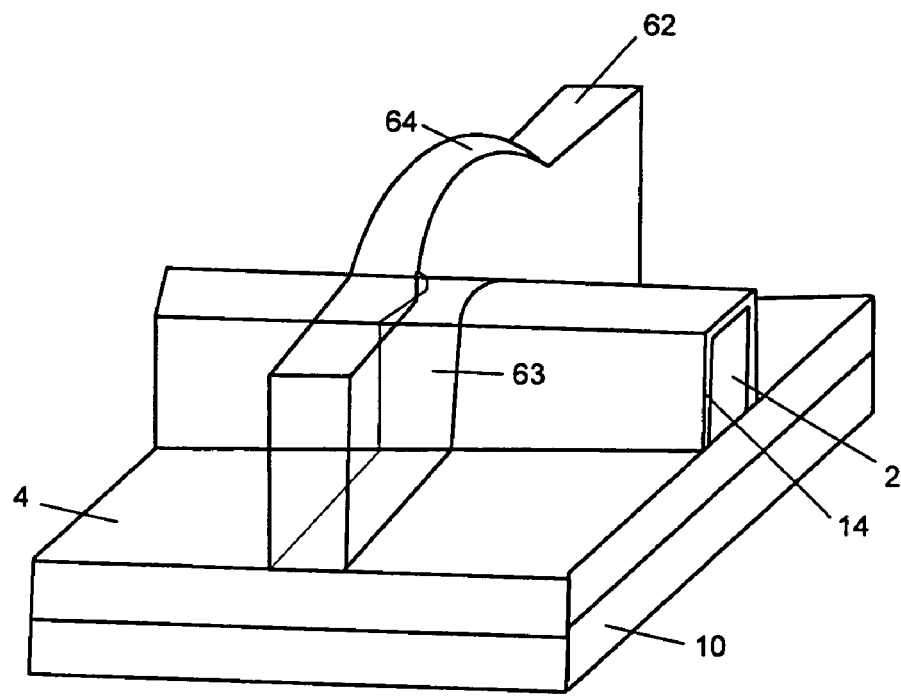
Figure 3E:
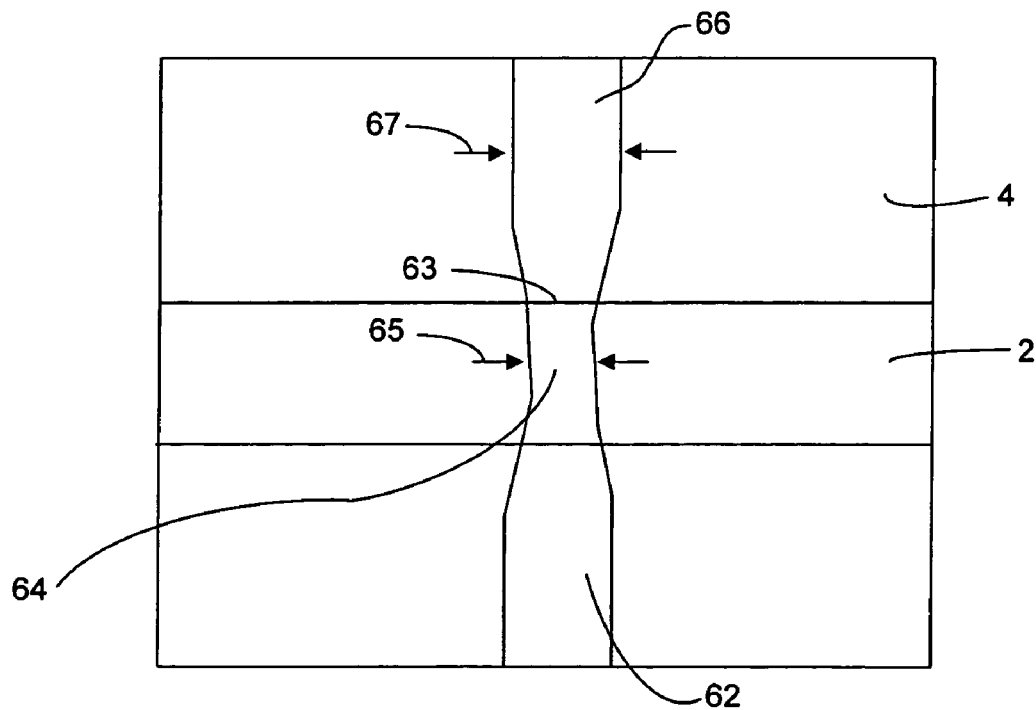
Figure 6C:
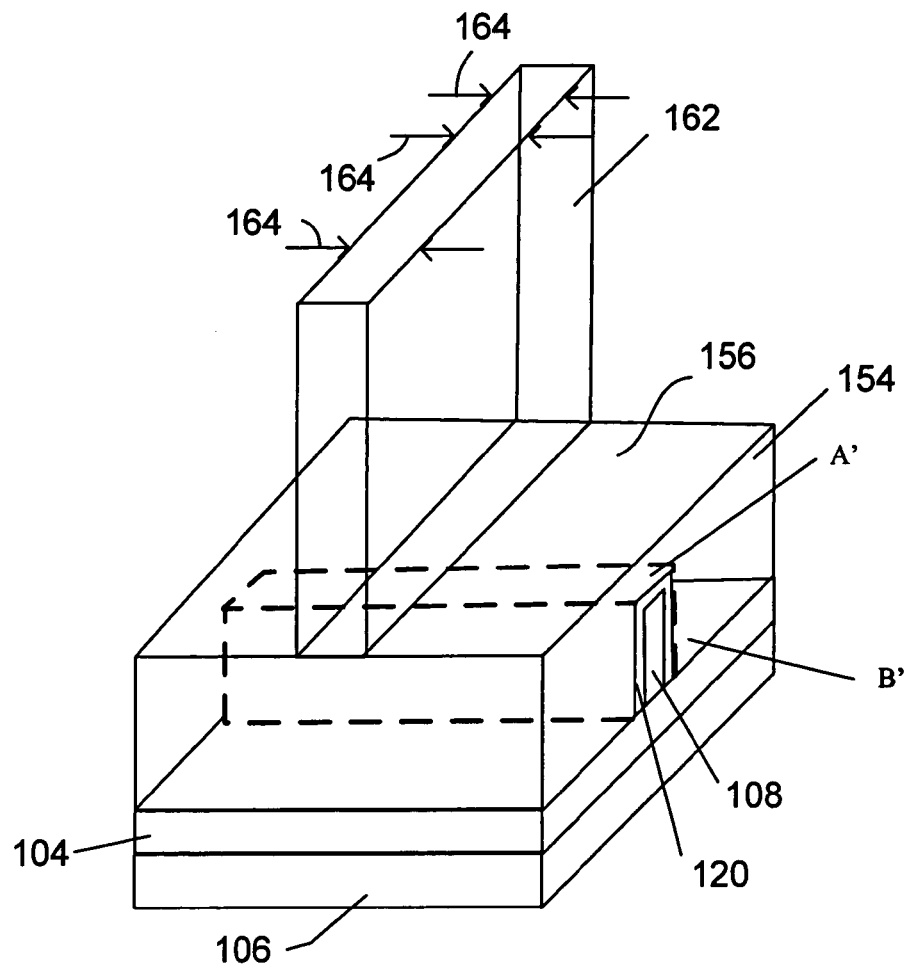

FIG. 6C shows patterned mask material 162 formed over planar top surface 156 of doped gate electrode material 154. Patterned mask material 162 may be formed using conventional photolithographic methods and using a photomask such as the photomask (46) shown in the prior art arrangement of FIG. 3B. In photomask 46 shown in the prior art arrangement shown in FIG. 3B, straight opaque region 48 has a substantially uniform width. An aspect of the invention is that width 164 of patterned mask material 162 is substantially uniform when formed from such a photomask feature having a uniform width, even when patterned mask material 162 steps over semiconductor fin 108. In other words, as a result of the substantially planarized top surface 156 and resulting uniform 166 thickness of mask material 160, a desired predefined pattern can be accurately transferred onto mask material 160 to form patterned mask 162.

Figure 6D:
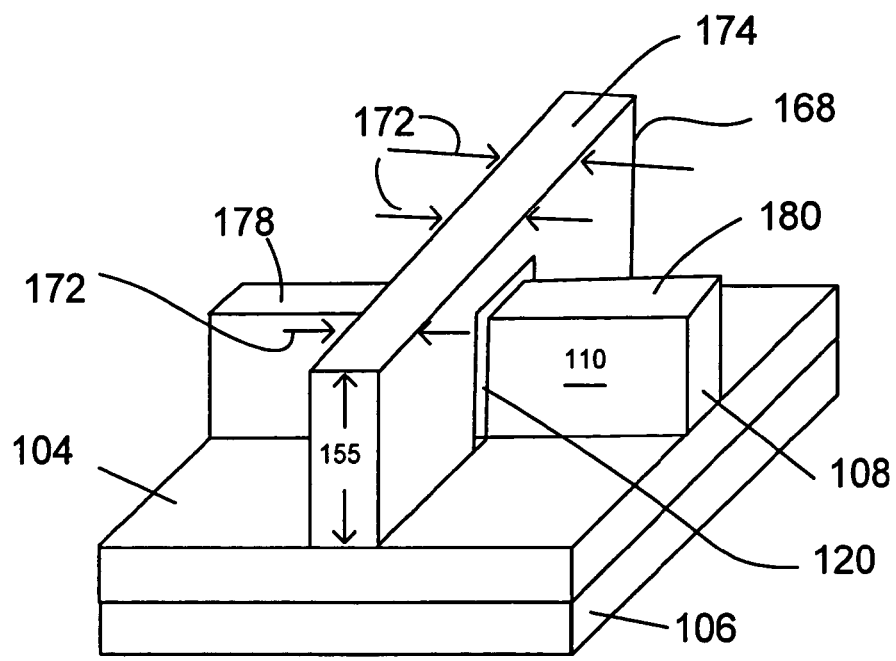

This pattern is then transferred to the gate electrode material by an etching process, preferably a dry plasma etching process, to produce gate electrode 168 shown in FIG. 6D after patterned mask material 162 has been removed. The etching process used to etch uncovered (unmasked) portions of the doped gate electrode material 154 may also remove some or all of the gate dielectric 120. In embodiments whereby some or all of gate dielectric 120 remains on semiconductor fin 108 after the etching process, a subsequent plasma etching procedure may be used to completely remove gate dielectric 120 and expose semiconductor fin 108, including sidewalls 110 and opposed portions 178, 180 that will form the source/drain regions. FIG. 6D shows gate electrode 168 that orthogonally traverses, i.e., straddles, semiconductor fin 108. Gate electrode 168 includes top surface 174 and constant width 172. The etching process or processes removes all of the uncovered portions of the gate electrode material and the gate dielectric thereby exposing semiconductor fin 108 and insulating layer 104. In the exemplary embodiment, gate electrode 168 forms a right angle with semiconductor fin 108 but other arrangements may be used in other exemplary embodiments.

The source and drain regions are formed in opposed portions 178, 180 of semiconductor fin 108 that are adjacent gate electracle 168. The formation of the source and drain regions may involve many steps. In one exemplary embodiment, an ion implantation process is performed to dope the source and drain regions 178, 180 immediately adjacent the channel region formed where gate electrode 168 straddles semiconductor fin 108. In one exemplary embodiment, the ion implantation process takes place immediately after the gate electrode material and gate dielectric etching processes are concluded and prior to removal of the patterned mask material 162 shown in FIG. 6C. Stated alternatively, an initial ion implantation process may take place in between the processing locations depicted in FIGS. 6C and 6D, and with patterned mask material 162 still intact but after the unmasked portion of gate electrode material and gate dielectric have been removed, i.e., the gate electrode is protected from being implanted. In another exemplary embodiment, the source/drain ion implantation process may take place after the removal of the mask material and upon the structure shown in FIG. 6D. The ion implantation process or processes are chosen to provide a substantially uniform dopant profile throughout source/drain regions 178, 180 of semiconductor fin 108, including substantial uniformity in both the vertical and lateral directions. Various implant conditions may be used to achieve this.

Figure 6E:
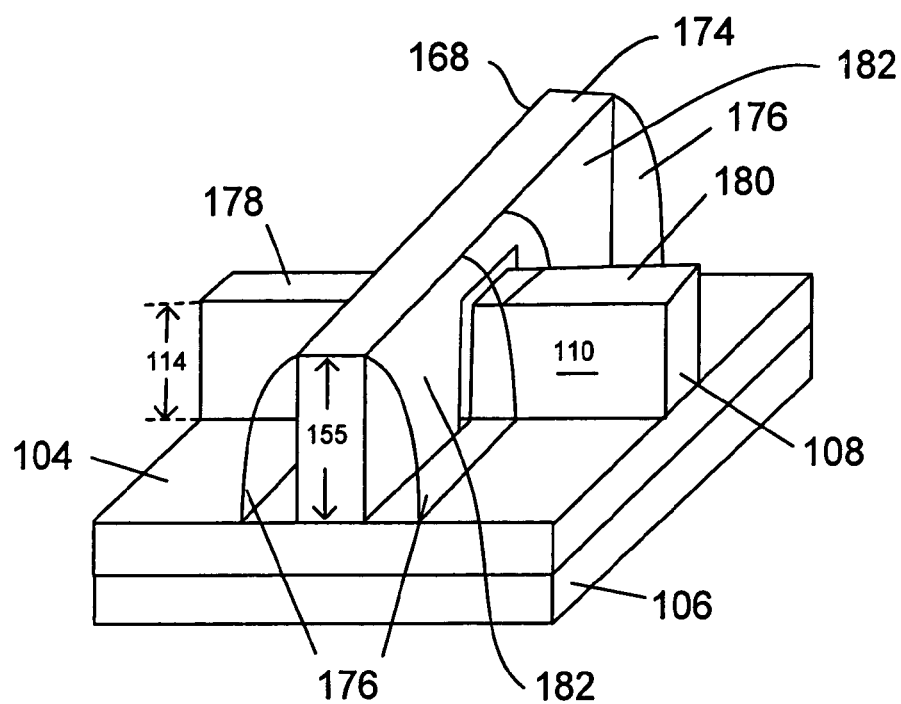
Figure 6F:
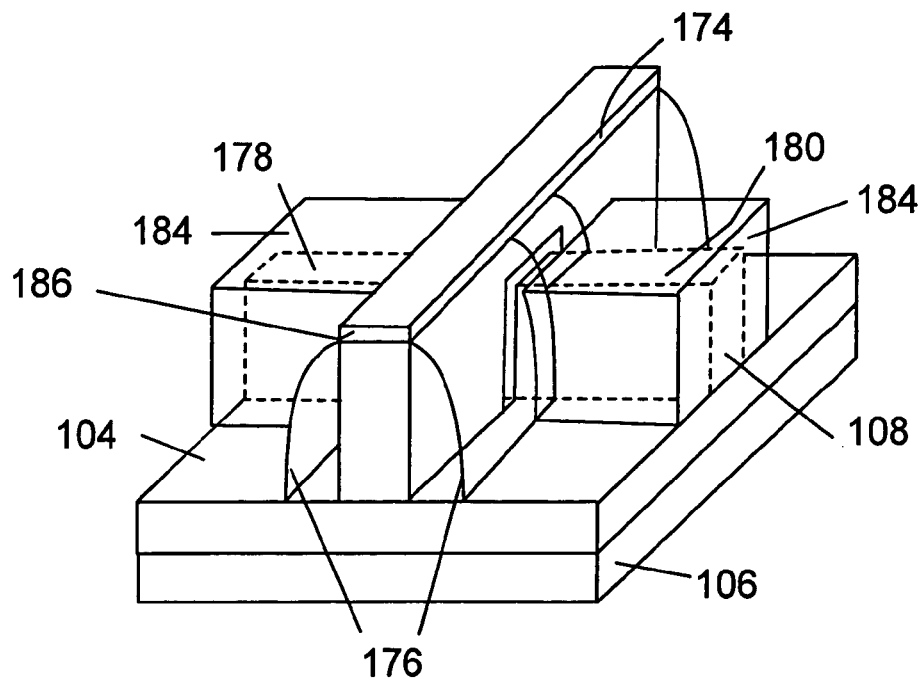

Spacers 176 are formed on sidewalls 182 of gate electrode 168 as shown in FIG. 6E. Spacers 176 may be formed by deposition of an insulating spacer material followed by anisotropic etching of the insulating spacer material. In one exemplary embodiment, the spacer material may be silicon nitride and in another exemplary embodiment it may be a stack of dielectric materials including a silicon nitride layer and a silicon oxide layer. When an isotropic etching process is performed on the spacer material formed over gate electrode 168 and semiconductor fin 108, spacers form along sidewalls of each. Because height 155 of gate electrode 168 is greater than height 114 of semiconductor thin 108, the spacers formed alongside semiconductor fin 108 will be receded and completely removed prior to spacers 176 illustrated alongside gate electrode 168. In an exemplary embodiment, the heights 155 and 114 may be chosen such that a substantially intact spacer 176 remains along sidewalls 182 of gate electrode 168 while any spacers formed alongside semiconductor fin 108 are substantially removed. This exemplary embodiment is illustrated in FIG. 6E. In other exemplary embodiments, in which the spacers are removed from alongside semiconductor fin 108, the remaining spacers alongside sidewalls 182 may be substantially smaller than the illustrated spacers 176 and may not extend up to top surface 174 of gate electrode 168. In another exemplary embodiment in which spacer 176 does extend substantially to top surface 174 of gate electrode 168, smaller spacers may also remain along the lower portions of sidewalls 110 of semiconductor fin 108.

After spacers are formed as shown in FIG. 6E, a selective epitaxial growth process is performed to increase the width 112 and height 114 of semiconductor fin 108 in the source/drain regions (178, 180) adjacently opposite gate electrode 168. More particularly, selective epitaxial growth will take place on exposed portions of source/drain regions 178, 180 of semiconductor fin 108; that is, on top surface 180 and the exposed portions of sidewalls 110 that are not masked by the presence of a spacer material as described above. In the illustrated embodiment, sidewalls 110 are illustrated to be free of spacers for clarity in illustrating the selective epitaxial growth process. The selective epitaxial growth process may be a CVD operation and may result in the epitaxial growth in the source and drain regions as well as over top surface 174 of gate electrode 168, to produce epitaxial layers 184 and 186 respectively. The epitaxial growth process may also be used to incorporate dopants into the source/drain areas. An optional ion implantation process may be performed to additionally dope source and drain regions 178, 180, especially if they were not incorporated during the epitaxial growth process. Conventional low energy ion implantation processes may be used to introduce dopant impurities into the source/drain regions, to a shallow implant depth. A silicidation process may optionally be carried out to form a silicide on source/drain regions 178, 180 and top surface 174 of gate electrode 168. Conventional patterning processes may be used to mask PMOS transistors during the implantation of NMOS transistors, and vice-versa. Subsequent conventional processing operations may then be used to wire the multiple-gate transistor to other devices and features to form a functional semiconductor device.

Figure 7:
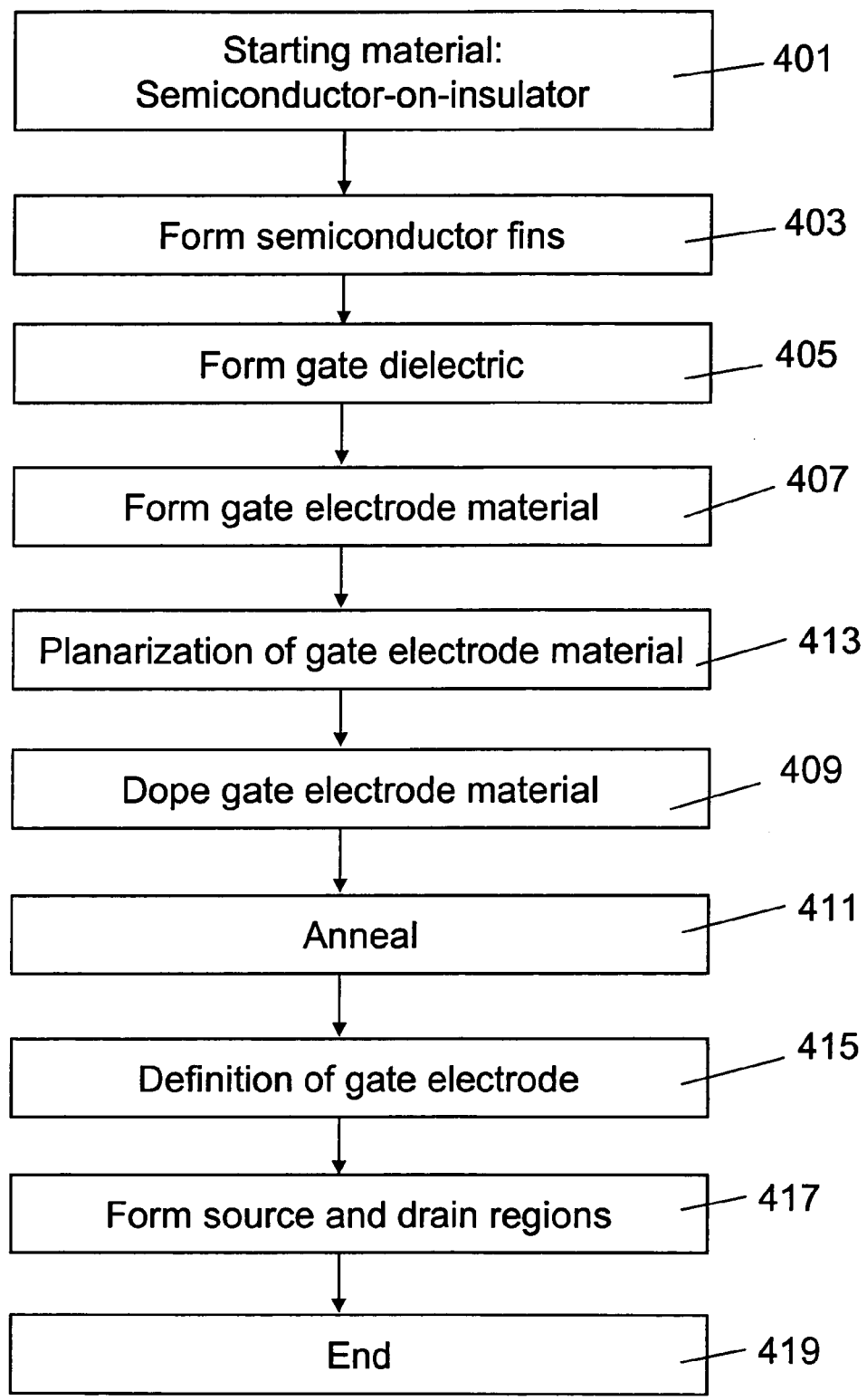
FIG. 7 is a flowchart showing an exemplary second method for forming a patterned gate electrode according to the invention.

A second method, i.e., a second sequence of processing operations, of the invention is shown in the flowchart of FIG. 7. FIG. 7 includes the same processing operations shown in FIG. 4, but the processing operations are performed in different sequence. Notably, the step of "planarization of gate electrode material" 413, is performed before the operations of doping the gate electrode material and annealing, steps 409 and 411, respectively. The sequence of processing operations shown in FIG. 7 may also be performed upon multiple-gate transistors that may be double-gate transistors, triple-gate transistors, omega-FETs or other suitable multiple gate transistors.

Figure 8A:
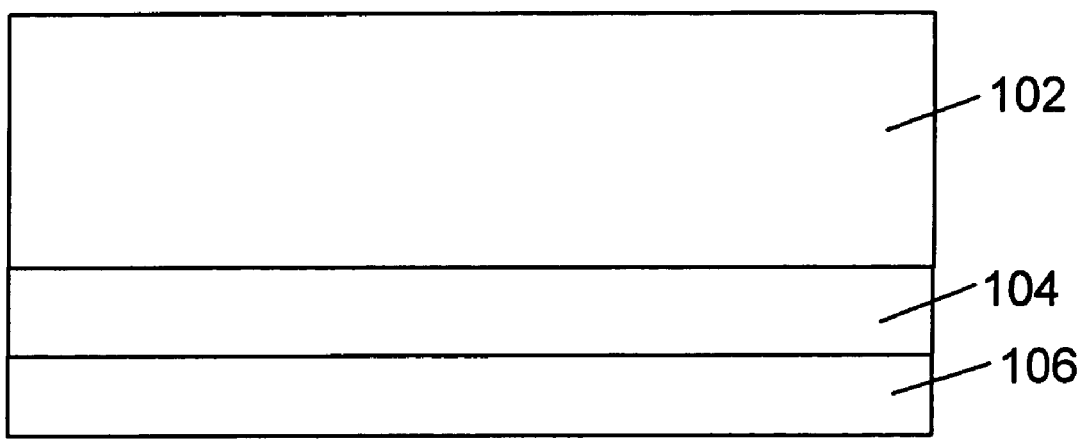
FIGS. 8A–8G are cross-sectional views showing the first part of the sequence of processing operations used to form a pattered gate electrode according to the second exemplary method of the invention as provided in FIG. 7.
Figure 8B:
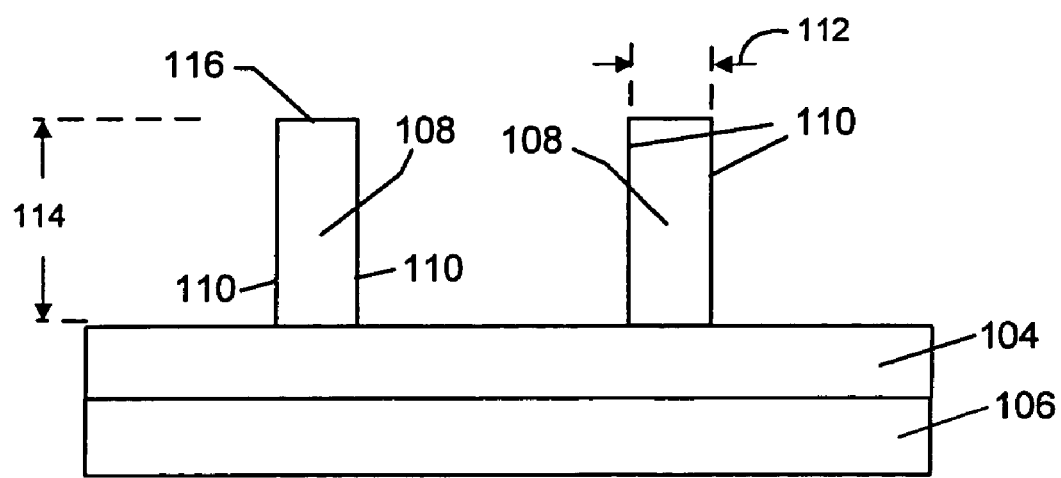
Figure 8C:
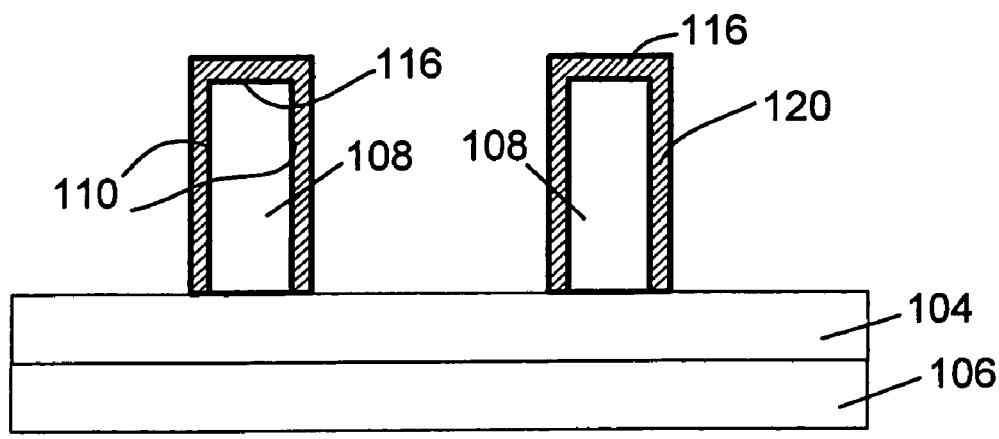
Figure 8D:
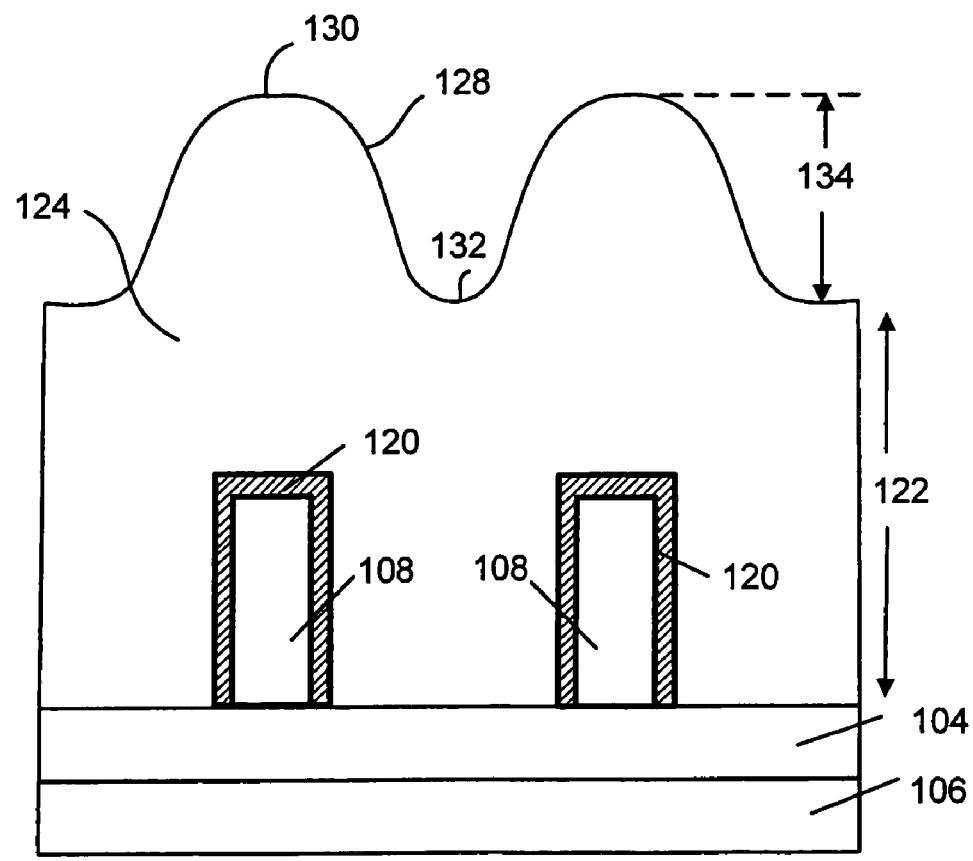
Figure 8E:
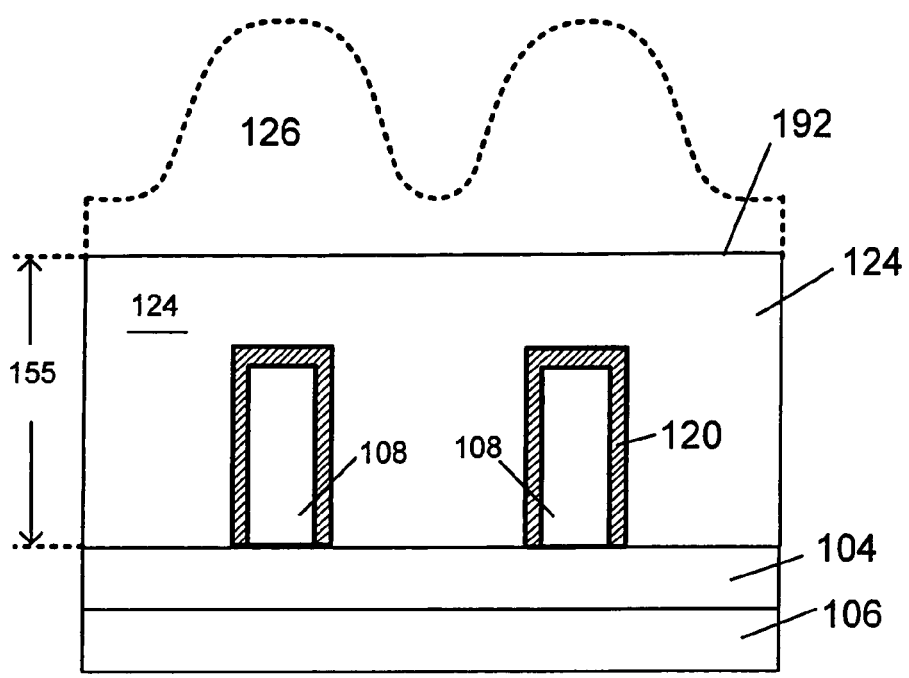
Figure 8F:
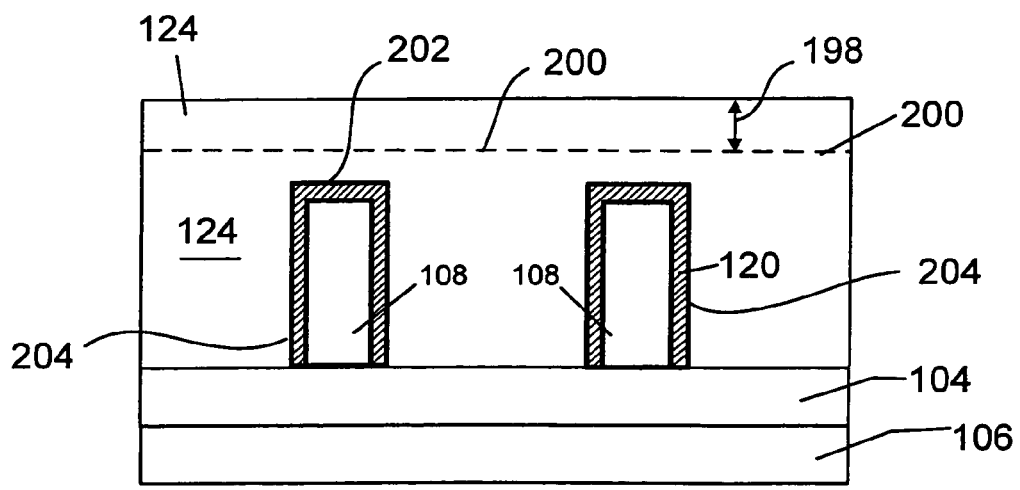
Figure 8G:
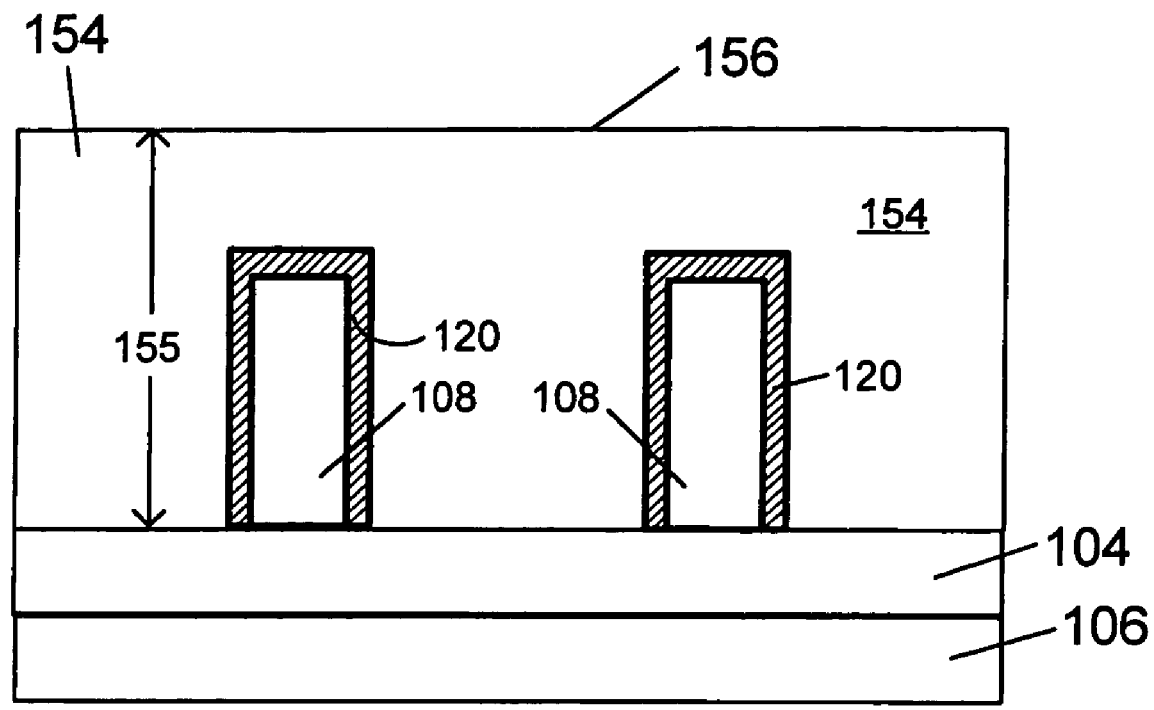

The first portion of this second sequence of processing operations is illustrated by FIGS. 8A–8G. After this structure shown in FIG. 8G is formed, the sequence of processing operations represented by FIGS. 6A–6F is used to produce the multiple-gate transistor with adjacently opposite source/drain regions formed in the semiconductor fin.

FIGS. 8A–8D correspond identically to FIGS. 5A–5D and are described in conjunction with FIGS. 5A–5D. According to the second method of the invention as presented by FIGS. 8A–8G in which the gate electrode material is planarized prior to doping, it would be advantageous for gate dielectric 120 to include enhanced immunity to dopant penetration. An enhanced immunity to dopant penetration may be accomplished if the gate dielectric includes a nitrogen-containing layer. According to the second exemplary embodiment, gate dielectric 120 may advantageously include a silicon nitride or a silicon oxynitride layer as deposited. In one exemplary embodiment, gate dielectric 120 may be a silicon nitride layer overlaying a silicon oxide layer. Alternatively, if gate dielectric 120 does not contain nitrogen as formed, an additional nitridation process may be performed upon the structure shown in FIG. 8C to enhance immunity to dopant penetration. The nitridation process may be an annealing process in a nitrogen-containing ambient, for example. In summary, according to the sequence of process operation of the second method of the invention, gate dielectric 120 shown in FIG. 8D advantageously includes nitrogen for enhanced dopant penetration immunity.

The undoped gate electrode material 124 is then planarized using CMP, for example, to produce the structure of FIG. 8E which includes planar surface 192 and height 155. FIG. 8E shows the structure including undoped gate electrode material 124 and removed portion 126 of undoped gate electrode material 124 is indicated by the dashed lines.

An ion implantation process, indicated by arrows 138, is then used to introduce dopant impurities into the structure as shown in FIG. 8F. Conventional or plasma immersion ion implantation may be used. Implant energy and other processing parameters of the ion implantation process are chosen to produce implant depth 198 whereby the location 200 of the peak concentration of implanted ions lies above semiconductor fins 108. In can be seen that location 200 of peak concentration of implanted ions is closer to the gate electrode material/gate dielectric interface at location 202 than the gate electrode material/gate dielectric interface at location 204. As such, nitrogen-containing gate dielectric 120 achieves enhanced immunity to the penetration of dopant impurities through the gate dielectric even at location 202 which is most prone to such penetration during the subsequent anneal process.

FIG. 8G illustrates doped gate electrode material 154 with planar top surface 156 after an annealing process has been carried out to activate doped gate electrode material 154. The annealing process is as described in conjunction with FIGS. 5A–5G. After the structure of FIG. 8G is formed, the processing operations shown in FIGS. 6A–6F and described in conjunction therewith, are then carried out to form the multiple-gate transistor which may then be further processed and wired to other components of the semiconductor device as desired.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for forming a gate electrode for a multiple gate transistor in a semiconductor device, comprising:
   providing a substructure comprising a semiconductor fin disposed over an insulating layer and a gate dielectric formed on said semiconductor fin;
   forming a gate electrode material over said gate dielectric and said semiconductor fin, said gate electrode material having a top surface that is non-planar as formed;
   introducing dopant impurities into said gate electrode material;
   after said introducing, annealing to activate said dopant impurities in said gate electrode material; and
   planarizing said top surface to form a planarized top surface that extends directly over said semiconductor fin.

2. The method as in claim 1, wherein said planarizing follows said introducing and said annealing.

3. The method as in claim 1, wherein said planarizing precedes said introducing and said annealing.

4. The method as in claim 3, wherein said gate dielectric includes nitrogen therein.

5. The method as in claim 1, further comprising patterning said gate electrode material to produce a gate electrode that traverses said semiconductor fin and includes said planarized top surface.

6. The method as in claim 5, further comprising forming source and drain regions in said semiconductor fin adjacent each of opposed sides of said gate electrode.

7. The method as in claim 6, further comprising forming spacers on sides of said gate electrode and forming a silicide in at least one of said gate electrode and said source and drain regions.

8. The method as in claim 5, further comprising:
   forming spacers on sides of said gate electrode;
   performing selective epitaxy on exposed portions of said semiconductor fin; and
   forming source and drain regions in said semiconductor fin adjacent each of opposed sides of said gate electrode.

9. The method as in claim 5, wherein said patterning comprises forming a patterned masking layer over said gate electrode material and etching portions of said gate electrode material not covered by said patterned masking layer.

10. The method as in claim 9, wherein said etching comprises plasma etching.

11. The method as in claim 9, further comprising introducing dopant impurities into said semiconductor fin to form source and drain regions therein prior to removing said patterned masking layer.

12. The method as in claim 1, wherein said forming a gate electrode material comprises forming a substantially conformal film.

13. The method as in claim 1, wherein said semiconductor fin is formed of silicon.

14. The method as in claim 1, wherein said semiconductor fin is formed of at least silicon and germanium.

15. The method as in claim 1, wherein said semiconductor fin is a lead extending longitudinally over said insulating layer and having a height greater than its width.

16. The method as in claim 1, wherein said introducing comprises introducing one of P-type dopant impurities, said P-type dopant impurities including at least one of boron and indium, and N-type dopant impurities, said N-type dopant impurities including at least one of phosphorus, arsenic, and antimony.

17. The method as in claim 1, wherein said introducing comprises one of ion implantation and plasma immersion ion implantation and includes a dopant impurity dose of at least $1\times10^{15}$ cm$^{-2}$.

18. The method as in claim 1, wherein said providing includes said substructure including a masking layer formed over a top surface of said semiconductor fin and said forming further includes forming said gate electrode material over said masking layer.

19. The method as in claim 1, wherein said gate dielectric covers sidewalls and a top of said semiconductor fin.

20. The method as in claim 1, wherein said providing includes said insulating layer having a depressed portion encroaching said semiconductor fin and resulting in a notch, and wherein said forming a gate electrode material includes filling said notch.

21. The method as in claim 1, wherein said gate dielectric is formed of one of silicon oxide and of silicon oxynitride.

22. The method as in claim 1, wherein said gate dielectric includes at least one of $La_2O_3$, $Al_2O_3$, $HfO_2$, HfON, and $ZrO_2$.

23. The method as in claim 1, wherein said gate dielectric is formed of a material having a permittivity, relative to free space, being greater than 5.

24. The method as in claim 1, wherein said gate electrode material comprises polycrystalline silicon.

25. The method as in claim 1, wherein said gate electrode material is formed of a conductive material.

26. The method as in claim 1, wherein said planarizing produces said gate electrode material having a height substantially greater than a semiconductor fin height.

27. A method for forming a gate electrode for a multiple gate transistor in a semiconductor device, comprising:
   providing a substructure comprising a semiconductor fin disposed over an insulating layer and a gate dielectric disposed on said semiconductor fin;
   forming a gate electrode material over said gate dielectric and said semiconductor fin, said gate electrode material having a top surface that is non-planar as formed;
   introducing dopant impurities into said gate electrode material;
   after said introducing, annealing to activate said dopant impurities within said gate electrode material;
   after said annealing, planarizing said top surface to form a planarized top surface that extends directly over said semiconductor fin;
   patterning said gate electrode material to produce a gate electrode that traverses said semiconductor fin and includes said planarized top surface;
   forming spacers on sides of said gate electrode; and
   performing selective epitaxy on exposed portions of said semiconductor fin but not on said spacers thereby increasing height and width of said semiconductor fin.

28. A method for forming a gate electrode for a multiple gate transistor in a semiconductor device, comprising:
   providing a substructure comprising a semiconductor fin disposed over an insulating layer and a gate dielectric disposed on said semiconductor fin, said semiconductor fin being a lead extending longitudinally over said insulating layer and having a height greater than its width;
   forming a gate electrode material over said gate dielectric and said semiconductor fin, said gate electrode material having a non-planar top surface;
   introducing dopant impurities into said gate electrode material;
   after said introducing, annealing to activate said dopant impurities in said gate electrode material;
   planarizing said top surface to form a planarized top surface;
   forming a patterned masking layer over said gate electrode material;
   etching portions of said gate electrode material not covered by said patterned masking layer to produce a gate electrode that traverses said semiconductor fin;
   with said patterned masking layer in place, introducing dopant impurities into said semiconductor fin to form source and drain active regions therein; and
   then removing said patterned masking layer.

29. The method as in claim 28, further comprising forming spacers on sidewalls of said gate electrode and epitaxially growing a further film on exposed portions of said source and drain active regions.

* * * * *

UNITED STATES PATENT AND TRADEMARK OFFICE
CERTIFICATE OF CORRECTION

PATENT NO. : 7,176,092 B2  
APPLICATION NO. : 10/825872  
DATED : February 13, 2007  
INVENTOR(S) : Yee-Chia Yoo et al.

Page 1 of 1

It is certified that error appears in the above-identified patent and that said Letters Patent is hereby corrected as shown below:

Column 2, line 36, delete "(GM)" and insert therefore -- (GAA) --.

Column 10, line 14, after "over" insert -- (original) --.

Signed and Sealed this

Seventh Day of August, 2007

JON W. DUDAS  
*Director of the United States Patent and Trademark Office*